(12) United States Patent
Matsuda

(10) Patent No.: US 12,469,804 B2
(45) Date of Patent: Nov. 11, 2025

(54) SEMICONDUCTOR DEVICE, MONOLITHIC MICROWAVE INTEGRATED CIRCUIT, SEMICONDUCTOR PACKAGE, AND METHOD OF MANUFACTURING SEMICONDUCTOR DEVICE

(71) Applicant: SUMITOMO ELECTRIC DEVICE INNOVATIONS, INC., Kanagawa (JP)

(72) Inventor: Keita Matsuda, Kanagawa (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 453 days.

(21) Appl. No.: 18/177,388

(22) Filed: Mar. 2, 2023

(65) Prior Publication Data
US 2023/0411315 A1    Dec. 21, 2023

(30) Foreign Application Priority Data
Jun. 15, 2022   (JP) .................................. 2022-096881

(51) Int. Cl.
*H01L 23/66*    (2006.01)
(52) U.S. Cl.
CPC ...... *H01L 23/66* (2013.01); *H01L 2223/6611* (2013.01); *H01L 2223/6644* (2013.01)

(58) Field of Classification Search
CPC ............. H01L 23/66; H01L 2223/6611; H01L 2223/6644; H01L 23/5223; H01L 23/642
See application file for complete search history.

(56) References Cited

FOREIGN PATENT DOCUMENTS

JP       2004-047575        2/2004

*Primary Examiner* — Tucker J Wright
(74) *Attorney, Agent, or Firm* — IPUSA, PLLC

(57) ABSTRACT

A semiconductor device includes a semiconductor substrate, a semiconductor element formed on the semiconductor substrate, a first insulating film covering the semiconductor element, a second insulating film formed on the first insulating film, and a third insulating film formed on the second insulating film. The first and third insulating films allow less moisture to pass than the second insulating film. A dielectric constant of the second insulating film is lower than dielectric constants of the first and third insulating films. The first insulating film has a first portion that is in contact with a first region of an upper surface of the semiconductor substrate. The third insulating film has a second portion that is in contact with upper and side surfaces of the first portion and a second region of the upper surface. The second region is farther away from the semiconductor element than the first region.

12 Claims, 24 Drawing Sheets

SEMICONDUCTOR DEVICE, MONOLITHIC MICROWAVE INTEGRATED CIRCUIT, SEMICONDUCTOR PACKAGE, AND METHOD OF MANUFACTURING SEMICONDUCTOR DEVICE

CROSS-REFERENCE TO RELATED APPLICATIONS

This application claims priority to Japanese Patent Application No. 2022-096881, filed on Jun. 15, 2022, the entire subject matter of which is incorporated herein by reference.

TECHNICAL FIELD

The present disclosure relates to a semiconductor device, a monolithic microwave integrated circuit, a semiconductor package, and a method of manufacturing a semiconductor device.

BACKGROUND

A semiconductor device in which an interlayer insulating film is provided on a semiconductor substrate is known. In the semiconductor device, an organic interlayer insulating film and an inorganic film are stacked in order to improve moisture resistance (Japanese Laid-Open Patent Application Publication No. 2004-47575).

SUMMARY

According to an embodiment of the present disclosure, a semiconductor device includes a semiconductor substrate, a semiconductor element formed on the semiconductor substrate, a first insulating film covering the semiconductor element, a second insulating film formed on the first insulating film, and a third insulating film formed on the second insulating film. The first insulating film and the third insulating film allow less moisture to pass than the second insulating film. A dielectric constant of the second insulating film is lower than a dielectric constant of the first insulating film and a dielectric constant of the third insulating film. The first insulating film has a first portion that is in contact with a first region of an upper surface of the semiconductor substrate. The third insulating film has a second portion that is in contact with an upper surface and a side surface of the first portion and that is in contact with a second region of the upper surface of the semiconductor substrate. The second region is farther away from the semiconductor element than the first region.

DETAILED DESCRIPTION

Figure 1:
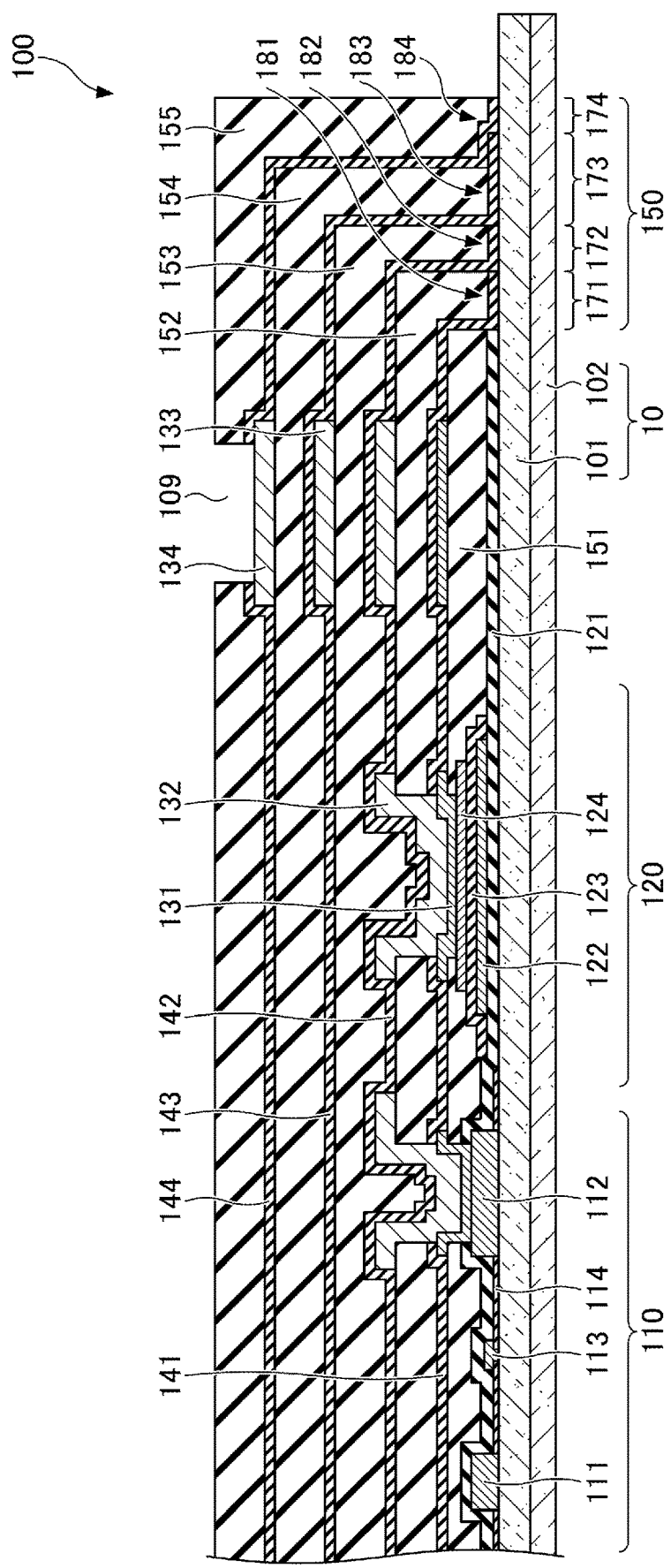
FIG. 1 is a cross-sectional view illustrating a semiconductor device according to a first embodiment.

In recent years, as a semiconductor substrate becomes thinner, the semiconductor substrate is more likely to be warped. When the warp occurs, an inorganic film easily peels off from the semiconductor substrate. The peeling of the inorganic film lowers the moisture resistance of the semiconductor device.

According to the present disclosure, the moisture resistance can be improved.

DESCRIPTION OF EMBODIMENTS OF THE PRESENT DISCLOSURE

First, embodiments of the present disclosure will be listed and described.

[1] A semiconductor device according to an aspect of the present disclosure includes a semiconductor substrate, a semiconductor element formed on the semiconductor substrate, a first insulating film covering the semiconductor element, a second insulating film formed on the first insulating film, and a third insulating film formed on the second insulating film. The first insulating film and the third insulating film allow less moisture to pass than the second insulating film. A dielectric constant of the second insulating film is lower than a dielectric constant of the first insulating film and a dielectric constant of the third insulating film. The first insulating film has a first portion that is in contact with a first region of an upper surface of the semiconductor substrate. The third insulating film has a second portion that is in contact with an upper surface and a side surface of the first portion and that is in contact with a second region of the upper surface of the semiconductor substrate. The second region is farther away from the semiconductor element than the first region.

The third insulating film is in contact with the upper surface and the side surface of the first portion of the first insulating film and the second region of the semiconductor substrate. Thus, the adhesion of the first insulating film and the third insulating film to the semiconductor substrate is improved. As a result, even if the semiconductor substrate is warped, the first insulating film and the third insulating film are less likely to peel off from the semiconductor substrate. Therefore, the moisture resistance of the semiconductor device can be improved, and the reliability can be improved. Additionally, because the second insulating film having a dielectric constant lower than the dielectric constants of the first insulating film and the third insulating film is included, an increase in the parasitic capacitance between the wiring layers can be suppressed by providing the wiring layers such that the second insulating film is sandwiched.

[2] In [1], the first insulating film and the third insulating film may include silicon nitride or silicon oxide, and the second insulating film may include polyimide. In this case, a low dielectric constant is easily obtained using polyimide while excellent moisture resistance is obtained using silicon nitride or silicon oxide.

[3] In [1] or [2], a plurality of inorganic films of at least one selected from the group consisting of a silicon nitride film and a silicon oxide film may be included, and the third insulating film may be the farthest away from the semiconductor element among the plurality of inorganic films. In this case, the inorganic film farthest away from the semiconductor element is in contact with the upper surface and the side surface of the first portion of the first insulating film, and is in contact with the second region of the semiconductor substrate. By causing the inorganic film that is separated from the semiconductor element to be less likely to peel off from the semiconductor substrate, entry of moisture into the semiconductor device from the outside can be suppressed.

[4] In any one of [1] to [3], the semiconductor substrate may have a first plane formed in the first region and a second plane formed in the second region, and the second plane may be closer to a lower surface of the semiconductor substrate than the first plane. In this case, a step is formed between the first plane and the second plane, so that the area, in which the third insulating film is in contact with the semiconductor substrate, increases. The increase in the area improves the adhesion between the semiconductor substrate and the third insulating film. As a result, the third insulating film does not easily peel off from the semiconductor substrate, and the moisture resistance of the semiconductor device is improved.

[5] In [4], the semiconductor substrate may include a substrate and a semiconductor layer formed on the substrate, and the second plane may be formed on the semiconductor layer. In this case, the adhesion between the third insulating film and the semiconductor layer is improved, and the moisture resistance of the semiconductor device is improved.

[6] In any one of [1] to [5], a wiring layer that is formed on the second insulating film and that is covered with the third insulating film may be included. In this case, the parasitic capacitance between the wiring layer formed on the second insulating film and a wiring layer formed closer to the semiconductor substrate than the wiring layer can be kept low.

[7] In any one of [1] to [6], the semiconductor device may further include a fourth insulating film formed between the first insulating film and the semiconductor element, and a fifth insulating film formed between the fourth insulating film and the semiconductor element. The fifth insulating film may allow moisture to pass less than the second insulating film and the fourth insulating film, a dielectric constant of the fourth insulating film may be lower than the dielectric constant of the first insulating film, the dielectric constant of the third insulating film, and a dielectric constant of the fifth insulating film, the fifth insulating film may have a third portion that is in contact with a third region closer to the semiconductor element than the first region of the upper surface of the semiconductor substrate, and the first insulating film may be in contact with an upper surface and a side surface of the third portion. The first insulating film is in contact with the upper surface and the side surface of the third portion of the fifth insulating film, so that the adhesion of the first insulating film and the fifth insulating film to the semiconductor substrate is improved. The adhesion is improved, and thus the first insulating film and the fifth insulating film are further less likely to peel off from the semiconductor substrate, thereby improving the moisture resistance.

[8] In [7], the fourth insulating film may include polyimide, and the fifth insulating film may include silicon nitride or silicon oxide. In this case, a low dielectric constant is easily obtained using polyimide while excellent moisture resistance is obtained using silicon nitride and silicon oxide.

[9] In any one of [1] to [8], the semiconductor element may include a high electron mobility transistor. In this case, the moisture resistance of the semiconductor device including the high electron mobility transistor can be improved.

[10] A monolithic microwave integrated circuit according to another aspect of the present disclosure includes the semiconductor device according to any one of [1] to [9]. In this case, the moisture resistance of the monolithic microwave integrated circuit can be improved.

[11] A semiconductor package according to another aspect of the present disclosure includes the semiconductor device according to any one of [1] to [9], and a resin that seals at least the upper surface and a side surface of the semiconductor device. In this case, the moisture resistance of the resin-sealed semiconductor package can be improved.

[12] A method of manufacturing a semiconductor according to another aspect of the present disclosure includes forming a semiconductor element on a semiconductor substrate, forming a first insulating film covering the semiconductor element and having a first portion that is in contact with a first region of an upper surface of the semiconductor substrate, forming a second insulating film on the first insulating film, and forming a third insulating film on the second insulating film. The first insulating film and the third insulating film allow less moisture to pass than the second insulating film. A dielectric constant of the second insulating film is lower than a dielectric constant of the first insulating film and a dielectric constant of the third insulating film. The third insulating film is formed to have a second portion that is in contact with an upper surface and a side surface of the first portion and that is in contact with a second region of the upper surface of the semiconductor substrate. The second region is farther away from the semiconductor element than the first region.

The third insulating film is in contact with the upper surface and the side surface of the first portion of the first insulating film and is in contact with the second region of the semiconductor substrate, so that the adhesion of the first insulating film and the third insulating film to the semiconductor substrate is improved. As a result, even if the semiconductor substrate is warped, the first insulating film and the third insulating film are less likely to peel off from the semiconductor substrate. Therefore, the moisture resistance of the semiconductor device can be improved, and the reliability can be improved. Additionally, because the second insulating film having a dielectric constant lower than the dielectric constant of the first insulating film and the dielectric constant of the third insulating film is formed, an increase in parasitic capacitance between the wiring layers can be suppressed by providing the wiring layers such that the second insulating film is sandwiched.

DETAILS OF EMBODIMENTS OF THE PRESENT DISCLOSURE

In the following, the embodiments of the present disclosure will be described in detail, but the present disclosure is not limited thereto. Here, in the present specification and the drawings, constituent elements having substantially the same functional configuration are denoted by the same reference numerals, and description thereof may be omitted.

First Embodiment

The embodiment of the present disclosure relates to a semiconductor device including a high electron mobility transistor (HEMT) using a nitride semiconductor. FIG. 1 is a cross-sectional view illustrating a semiconductor device according to a first embodiment.

A semiconductor device 100 according to the first embodiment is, for example, a monolithic microwave integrated circuit (MMIC). The semiconductor device 100 includes a semiconductor substrate 10, a semiconductor element formed thereon, such as a HEMT 110 and a capacitor 120. The semiconductor element may be a resistor or an inductor.

The semiconductor substrate 10 includes a substrate 102 and a semiconductor layer 101 formed thereon. The substrate 102 is a substrate for a gallium nitride (GaN)-based semiconductor growth. The substrate 102 is, for example, a silicon carbide (SiC) substrate. The thickness of the substrate 102 is, for example, within a range of 75 μm to 150 μm, and is, for example, 100 μm. The semiconductor layer 101 includes a GaN-based nitride semiconductor layer. The thickness of the nitride semiconductor layer is, for example, within a range of 0.5 μm to 3.0 μm, and is, for example, 1.0 μm. Here, a gallium arsenide (GaAs)-based semiconductor layer may be used as the semiconductor layer 101.

Here, an enlarged view of the semiconductor substrate 10 in the semiconductor device according to the first embodiment will be described with reference to FIG. 2.

Figure 2:
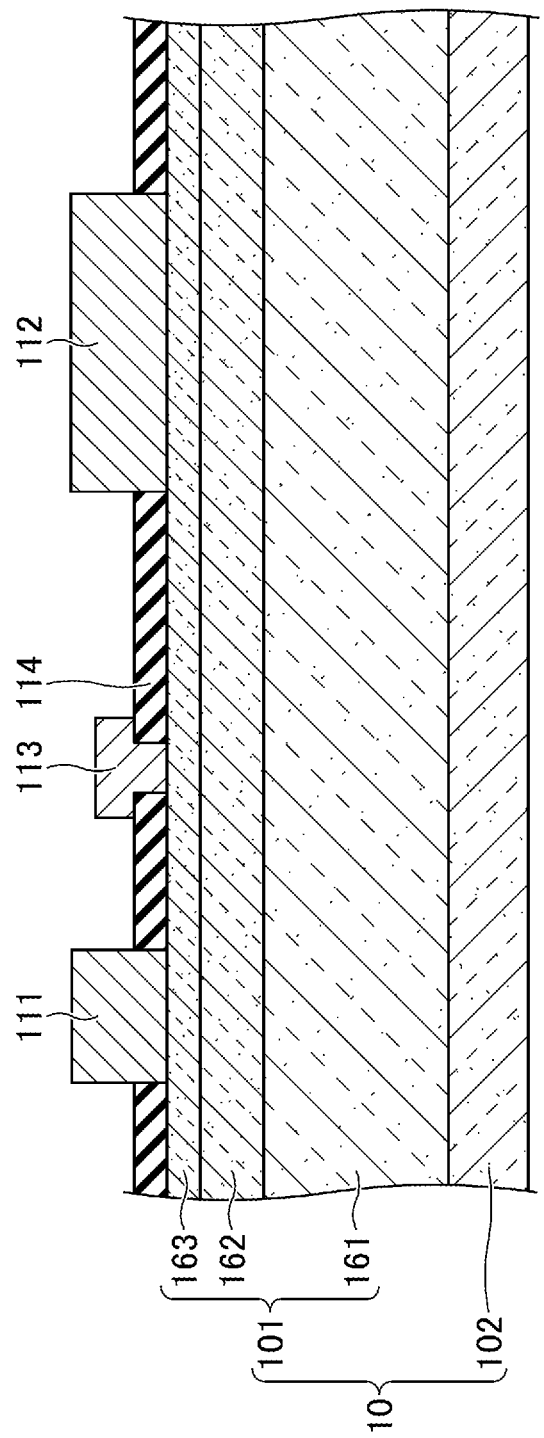
FIG. 2 is an enlarged view of the semiconductor substrate according to the first embodiment.

As illustrated in FIG. 2, the semiconductor substrate 10 includes the substrate 102 and the GaN-based semiconductor layer 101. The GaN-based semiconductor layer 101 is epitaxially grown on the substrate 102 by using, for example, metal organic chemical vapor deposition (MOCVD). The semiconductor layer 101 includes a buffer layer 161, a channel layer 162, and an electron supply layer 163.

The buffer layer 161 is a GaN layer epitaxially grown on the substrate 102. The thickness of the buffer layer 161 is, for example, within a range of 300 nm to 1000 nm, and is, for example, 500 nm.

The channel layer 162 is a GaN layer epitaxially grown on the buffer layer 161. The thickness of the channel layer 162 is within a range of 5 nm to 15 nm, and is, for example, 10 nm.

The electron supply layer 163 is an aluminum gallium nitride (AlGaN) layer epitaxially grown on the channel layer 162. The thickness of the electron supply layer 163 is within a range of 20 nm to 40 nm, and is, for example, 30 nm.

The HEMT 110 includes a source electrode 111, a drain electrode 112, and a gate electrode 113 formed on the semiconductor layer 101. In the HEMT 110, multiple openings are formed in an insulating film 114, and the source electrode 111, the gate electrode 113, and the drain electrode 112 are formed inside the respective openings. As the insulating film 114, for example, a silicon nitride (SiN) film is used. The thickness of the insulating film 114 is, for example, 100 nm. The HEMT 110 further includes an insulating film 121 that covers the source electrode 111, the gate electrode 113, and the drain electrode 112, and that also covers the insulating film 114. As the insulating film 121, for example, a SiN film is used. The thickness of the insulating film 121 is, for example, 100 nm.

Each of the source electrode 111 and the drain electrode 112 is formed of an ohmic metal layer. The ohmic metal layer is formed, for example, by alloying a stacked structure of a titanium (Ti) layer or a tantalum (Ta) layer and an aluminum (Al) layer by heat treatment. The thickness of the Ti layer or the Ta layer is, for example, within a range of 5 nm to 20 nm, and is, for example, 10 nm. The thickness of the Al layer is, for example, within a range of 50 nm to 1000 nm, and is, for example, 500 nm.

The gate electrode 113 is provided on the semiconductor layer 101. The gate electrode 113 is disposed between the source electrode 111 and the drain 1/2 electrode 112. The gate electrode 113 has a stacked structure of, for example, a nickel (Ni) layer, a palladium (Pd) layer, and a gold (Au) layer. The thickness of the Ni layer is, for example, 100 nm, the thickness of the Pd layer is, for example, 50 nm, and the thickness of the Au layer is, for example, 500 nm. The Ni layer is in Schottky contact with the semiconductor layer 101.

The capacitor 120 includes a lower electrode 122, a dielectric film 123, and an upper electrode 124 formed in this order on the insulating film 121. Each of the lower electrode 122 and the upper electrode 124 is formed of, for example, a metal layer in which a Ti layer and an Au layer are stacked. The width of the lower electrode 122 is, for example, 160 μm, and the width of the upper electrode 124 is, for example, 150 μm. The thickness of the Ti layer is within a range of 10 nm to 300 nm, and is, for example, 100 nm. The thickness of the Au layer is within a range of 100 nm to 2000 nm, and is, for example, 1000 nm. The dielectric film 123 is formed of, for example, a SiN film or a silicon oxide (SiO) film. The thickness of the dielectric film 123 is within a range of 100 nm to 400 nm, and is, for example, 200 nm.

The semiconductor device 100 includes a first wiring layer 131 and a second wiring layer 132. The second wiring layer 132 is electrically connected to the source electrode 111 and the upper electrode 124 via the first wiring layer 131. Here, although not illustrated, the source electrode 111 and the gate electrode 113 are also connected to the first wiring layer 131 and the second wiring layer 132. Additionally, the semiconductor device 100 includes a third wiring layer 133, a fourth wiring layer 134, and an opening 109. Each of the first wiring layer 131, the second wiring layer 132, the third wiring layer 133, and the fourth wiring layer 134 includes a titanium tungsten (TiW) layer and an Au layer. The thickness of the TiW layer is, for example, 100 nm and the thickness of the Au layer is 2.0 µm.

The semiconductor device 100 includes a sixth insulating film 151, a seventh insulating film 141, an eighth insulating film 152, a fifth insulating film 142, a fourth insulating film 153, a first insulating film 143, a second insulating film 154, a third insulating film 144, and a ninth insulating film 155.

The seventh insulating film 141 covers the first wiring layer 131 and the upper surface and the side surface of the sixth insulating film 151. The eighth insulating film 152 covers the upper surface and the side surface of the seventh insulating film 141. The fifth insulating film 142 covers the second wiring layer 132 and the upper surface and the side surface of the eighth insulating film 152. The fourth insulating film 153 covers the upper surface and the side surface of the fifth insulating film 142.

The first insulating film 143 covers the third wiring layer 133 and the upper surface and the side surface of the fourth insulating film 153. The second insulating film 154 covers the upper surface and the side surface of the first insulating film 143. The third insulating film 144 covers the fourth wiring layer 134 and the upper surface and the side surface of the second insulating film 154. The ninth insulating film 155 covers the upper surface and the side surface of the third insulating film 144.

The seventh insulating film 141, the fifth insulating film 142, the first insulating film 143, and the third insulating film 144 respectively protect the first wiring layer 131, the second wiring layer 132, the third wiring layer 133, and the fourth wiring layer 134 from entry of moisture.

As described, the sixth insulating film 151, the eighth insulating film 152, the fourth insulating film 153, the second insulating film 154, and the ninth insulating film 155; and the seventh insulating film 141, the fifth insulating film 142, the first insulating film 143, and the third insulating film 144 are stacked. Furthermore, the sixth insulating film 151, the eighth insulating film 152, the fourth insulating film 153, the second insulating film 154, and the ninth insulating film 155; and the seventh insulating film 141, the fifth insulating film 142, the first insulating film 143, and the third insulating film 144 cover the upper portions and the side surfaces of the HEMT 110 and the capacitor 120. Additionally, the semiconductor device 100 includes an end portion 150. The end portion 150 surrounds all the semiconductor elements, such as the HEMT 110 and the capacitor 120, in a plan view perpendicular to the upper surface of the semiconductor substrate 10. The end portion 150 is, for example, within a range of a certain distance from the outer edge of the semiconductor substrate 10 toward the center of the semiconductor substrate 10.

Each of the sixth insulating film 151, the eighth insulating film 152, the fourth insulating film 153, the second insulating film 154, and the ninth insulating film 155 is, for example, a polyimide film. The polyimide film is used as an interlayer insulating film between each of the wiring layers among the first wiring layer 131 to the fourth wiring layer 134. Because the dielectric constant of the polyimide film is relatively low, an increase in the parasitic capacitance between the wiring layers can be suppressed. For example, by using the eighth insulating film 152 formed of polyimide, the parasitic capacitance between the first wiring layer 131 and the second wiring layer 132 can be kept low. By using the fourth insulating film 153 formed of polyimide, the parasitic capacitance between the second wiring layer 132 and the third wiring layer 133 can be kept low. Additionally, by using the second insulating film 154 formed of polyimide, the parasitic capacitance between the third wiring layer 133 and the fourth wiring layer 134 can be kept low. The thickness of each of the sixth insulating film 151, the eighth insulating film 152, the fourth insulating film 153, the second insulating film 154, and the ninth insulating film 155 is within a range of 1.0 µm to 5.0 µm, and is, for example, 2.0 µm.

The seventh insulating film 141, the fifth insulating film 142, the first insulating film 143, and the third insulating film 144 are, for example, silicon nitride (SiN) films. The thickness of each of the seventh insulating film 141, the fifth insulating film 142, the first insulating film 143, and the third insulating film 144 is within a range from 50 nm to 400 nm, and is, for example, 200 nm. Here, silicon oxide (SiO) films may be used as the seventh insulating film 141, the fifth insulating film 142, the first insulating film 143, and the third insulating film 144.

The first insulating film 143, the third insulating film 144, the fifth insulating film 142, and the seventh insulating film 141 allow less moisture to pass than the sixth insulating film 151, the eighth insulating film 152, the fourth insulating film 153, the second insulating film 154, and the ninth insulating film 155. Additionally, the dielectric constants of the sixth insulating film 151, the eighth insulating film 152, the fourth insulating film 153, the second insulating film 154, and the ninth insulating film 155 is lower than the dielectric constants of the first insulating film 143, the third insulating film 144, the fifth insulating film 142, and the seventh insulating film 141.

In the end portion 150, the seventh insulating film 141 has a portion that is in contact with the side surface of the sixth insulating film 151 and a fourth portion 181 that is in contact with the semiconductor layer 101 in a fourth region 171. In the end portion 150, the eighth insulating film 152 is in contact with the upper surface of the fourth portion 181 of the seventh insulating film 141 and the side surface of the seventh insulating film 141. in the end portion 150, the eighth insulating film 152 is not in contact with the semiconductor layer 101.

In the end portion 150, the fifth insulating film 142 has a portion that is in contact with the side surface of the eighth insulating film 152 and a third portion 182 that is in contact with the semiconductor layer 101 in a third region 172. In the end portion 150, the fourth insulating film 153 is in contact with the upper surface of the third portion 182 of the fifth insulating film 142 and the side surface of the fifth insulating film 142. In the end portion 150, the fourth insulating film 153 is not in contact with the semiconductor layer 101.

In the end portion 150, the first insulating film 143 has a portion that is in contact with the side surface of the fourth insulating film 153 and a first portion 183 that is in contact with the semiconductor layer 101 in a first region 173. In the end portion 150, the second insulating film 154 is in contact with the upper surface of the first portion 183 of the first insulating film 143 and the side surface of the first insulating film 143. Further, the first portion 183 protrudes to the outside from the side surface of the second insulating film 154. Here, the outside indicates a side close to the outer edge of the semiconductor substrate 10 when viewed from the HEMT 110 and the capacitor 120. In the end portion 150, the second insulating film 154 is not in contact with the semiconductor layer 101.

In the end portion 150, the third insulating film 144 has a portion that is in contact with the side surface of the second insulating film 154, a portion that is in contact with the first portion 183 of the first insulating film 143, and a second portion 184 that is in contact with a second region 174 of the semiconductor layer 101. In the end portion 150, the ninth insulating film 155 is in contact with the upper surface of the second portion 184 of the third insulating film 144 and the side surface of the third insulating film 144. In the end portion 150, the ninth insulating film 155 is not in contact with the semiconductor layer 101.

Here, a method of manufacturing the semiconductor device 100 according to the embodiment will be described. FIGS. 3 to 8 are cross-sectional views illustrating the method of manufacturing the semiconductor device 100 according to the embodiment.

Figure 3:
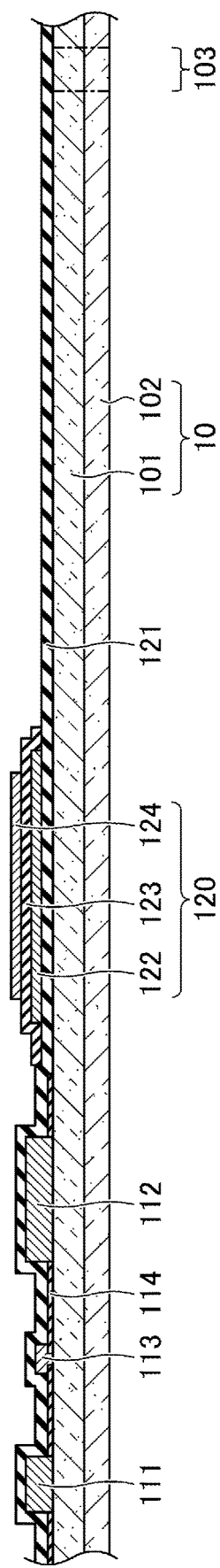
FIG. 3 is a first view illustrating a process of manufacturing the semiconductor device according to the first embodiment.

First, as illustrated in FIG. 3, the semiconductor substrate 10 is prepared. The semiconductor substrate 10 includes the substrate 102 and the semiconductor layer 101. The semiconductor layer 101 includes the buffer layer 161, the channel layer 162 that functions as an electron transit layer, and the electron supply layer 163. Strain is generated between the channel layer 162 and the electron supply layer 163 due to a difference in the lattice constant. Due to the strain, a two-dimensional electron gas (2DEG) is generated at the interface between the channel layer 162 and the electron supply layer 163 on the channel layer 162 side to form a channel region. A scribe region 103 is set in the semiconductor substrate 10.

Next, the insulating film 114 is formed on the semiconductor layer 101 where the HEMT 110 is formed. The insulating film 114 is formed by using, for example, chemical vapor deposition (CVD).

Subsequently, portions of the insulating film 114 corresponding to the source electrode 111 and the drain electrode 112 are etched using a mask to form openings. With this etching, the semiconductor layer 101 is exposed in each opening. An ohmic metal layer is formed on the exposed semiconductor layer 101. The step of forming the ohmic metal layer includes, for example, a step of forming a Ti layer and an Al layer on the exposed semiconductor layer 101 and alloying them by heat treatment. The Ti layer and the Al layer are formed by using, for example, vacuum deposition. The formed ohmic metal layers become the source electrode 111 and the drain electrode 112.

Subsequently, the insulating film 114 between the source electrode 111 and the drain electrode 112 is partly etched to form an opening. With this etching, the semiconductor layer 101 is exposed at the bottom of the opening. The gate electrode 113 is formed on the exposed semiconductor layer 101. The gate electrode 113 includes, for example, a Ni layer formed on the semiconductor layer 101 and an Au layer formed on the Ni layer.

Next, in order to form the capacitor 120, the insulating film 121 is formed on the entire surface by using CVD. The insulating film 121 covers the source electrode 111, the drain electrode 112, the gate electrode 113, the insulating film 114, and the entire surface of the semiconductor layer 101. The insulating film 121 is, for example, a SiN film.

Subsequently, in order to form the lower electrode 122, a metal layer including a Ti layer and an Au layer is formed on the entire surface of the insulating film 121. The metal layer is etched to leave a portion to be the lower electrode 122 of the capacitor 120 to form the lower electrode 122. Subsequently, the dielectric film 123 is formed on the entire surface of the lower electrode 122 by using CVD. Thereafter, unnecessary portions of the dielectric film 123 are etched to form the dielectric film 123 of the capacitor 120.

Subsequently, a metal layer is formed on the entire surface of the dielectric film 123. As the metal layer, a metal layer including a Ti layer and an Au layer used for the lower electrode 122 may be used. The metal layer faces the lower electrode 122 and is etched to leave a portion having the area necessary for securing a designed capacitance value to form the upper electrode 124.

Figure 4:
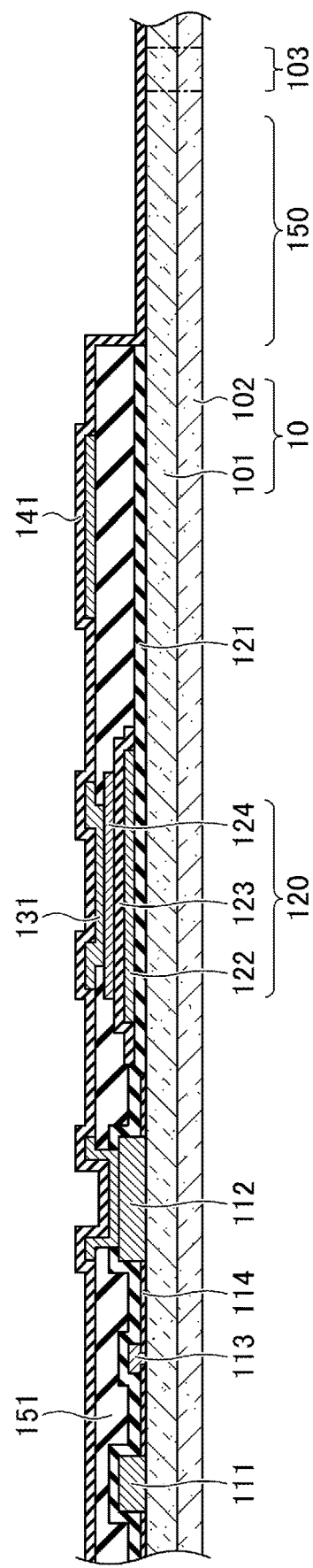
FIG. 4 is a second view illustrating the manufacturing process of the semiconductor device according to the first embodiment.

Subsequently, as illustrated in FIG. 4, the sixth insulating film 151, the first wiring layer 131, and the seventh insulating film 141 are formed. The sixth insulating film 151 is formed on the entire surface by using, for example, spin coating. The sixth insulating film 151 covers the upper electrode 124, the dielectric film 123, and the insulating film 121.

Subsequently, the sixth insulating film 151 is etched together with the insulating film 121 to expose the surface of the semiconductor layer 101 in the end portion 150. In this etching, the surfaces of the drain electrode 112 and the upper electrode 124 are also exposed.

Thereafter, the first wiring layer 131 is formed on the entire surface. The first wiring layer 131 is etched except for portions used for the drain electrode 112, the upper electrode 124, other wirings, and the like. With this etching, the first wiring layer 131 connected to the drain electrode 112 and the first wiring layer 131 connected to the upper electrode 124 are formed. Subsequently, the seventh insulating film 141 is formed on the entire surface by using CVD. The seventh insulating film 141 covers the first wiring layer 131, the sixth insulating film 151, and the semiconductor layer 101 of the end portion 150.

Figure 5:
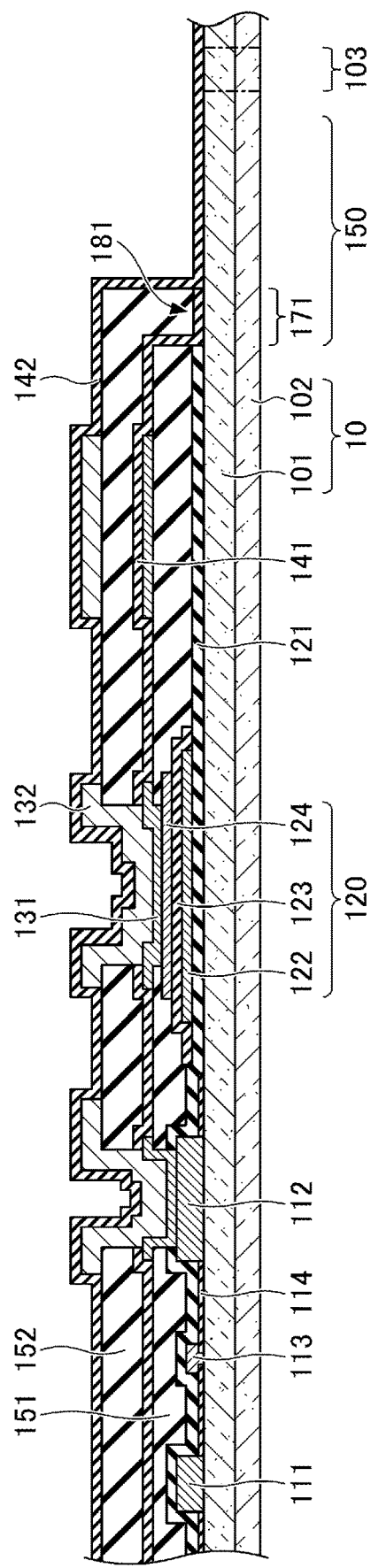
FIG. 5 is a third view illustrating the manufacturing process of the semiconductor device according to the first embodiment.

Subsequently, as illustrated in FIG. 5, the eighth insulating film 152, the second wiring layer 132, and the fifth insulating film 142 are formed. The eighth insulating film 152 is formed on the surface of the seventh insulating film 141 by using, for example, spin coating.

Subsequently, the seventh insulating film 141 is etched together with the eighth insulating film 152. With this etching, the fourth portion 181 of the seventh insulating film 141 is formed above the fourth region 171 in the end portion 150, and the eighth insulating film 152 remains above the fourth portion 181. With respect to the above, the surface of the semiconductor layer 101 is exposed outside of the fourth region 171 in the end portion 150. Additionally, in this etching, the surface of the first wiring layer 131 is also exposed.

Thereafter, the second wiring layer 132 is formed on the entire surface. The second wiring layer 132 is etched except for portions connected to the first wiring layer 131 and portions used for other wirings and the like. Subsequently, the fifth insulating film 142 is formed on the entire surface by using CVD. The fifth insulating film 142 covers the second wiring layer 132, the eighth insulating film 152, and a portion of the semiconductor layer 101 closer to the scribe region 103 than the fourth region 171.

Figure 6:
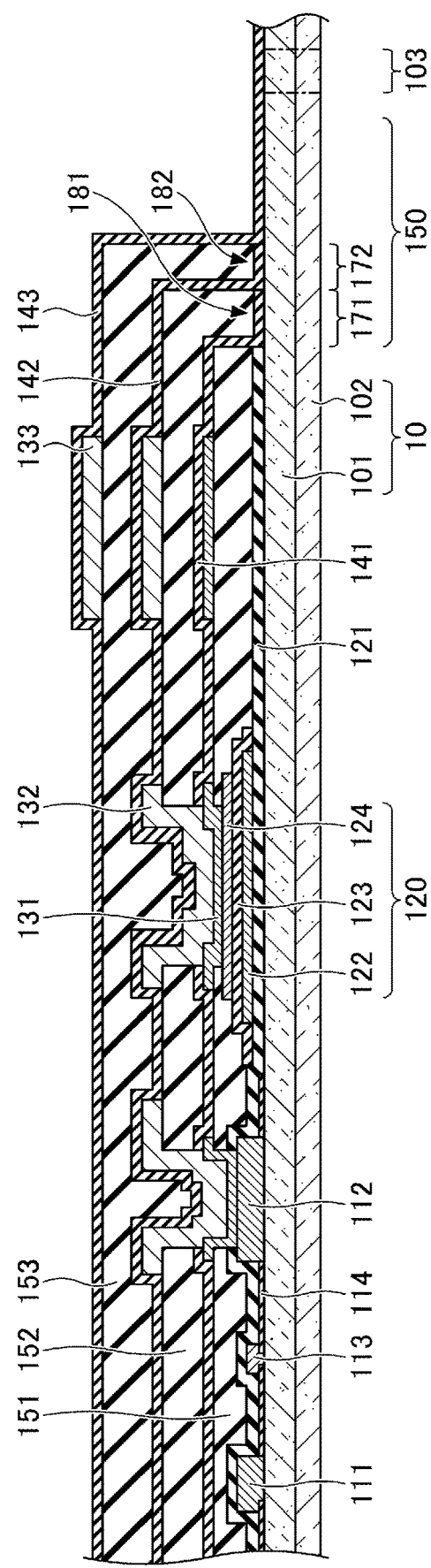
FIG. 6 is a fourth view illustrating the manufacturing process of the semiconductor device according to the first embodiment.

Subsequently, as illustrated in FIG. 6, the fourth insulating film 153, the third wiring layer 133, and the first insulating film 143 are formed. The fourth insulating film 153 is formed on the surface of the fifth insulating film 142 by using, for example, spin coating.

Subsequently, the fifth insulating film 142 is etched together with the fourth insulating film 153. With this etching, in the end portion 150, the third portion 182 of the fifth insulating film 142 is formed above the third region 172, and the fourth insulating film 153 remains above the third portion 182. At this time, the surface of the semiconductor layer 101 is exposed outside of the third region 172 in the end portion 150. Additionally, in this etching, the surface of the second wiring layer 132 is exposed as necessary.

Here, the third region 172 is located outside of the fourth region 171 on the side where the scribe region 103 is located and is in contact with the fourth region 171. Additionally, the fifth insulating film 142 is in contact with the seventh insulating film 141 that is exposed on the end of the fourth region 171 where the scribe region 103 is located.

Thereafter, the third wiring layer 133 is formed on the entire surface. The third wiring layer 133 is etched except for a portion connected to the exposed surface of the second wiring layer 132 and portions used for other wirings and the like. Subsequently, the first insulating film 143 is formed on the entire surface. The first insulating film 143 covers the third wiring layer 133, the fourth insulating film 153, and the surface of the semiconductor layer 101 outside of the third region 172 on the side where the scribe region 103 is located.

Figure 7:
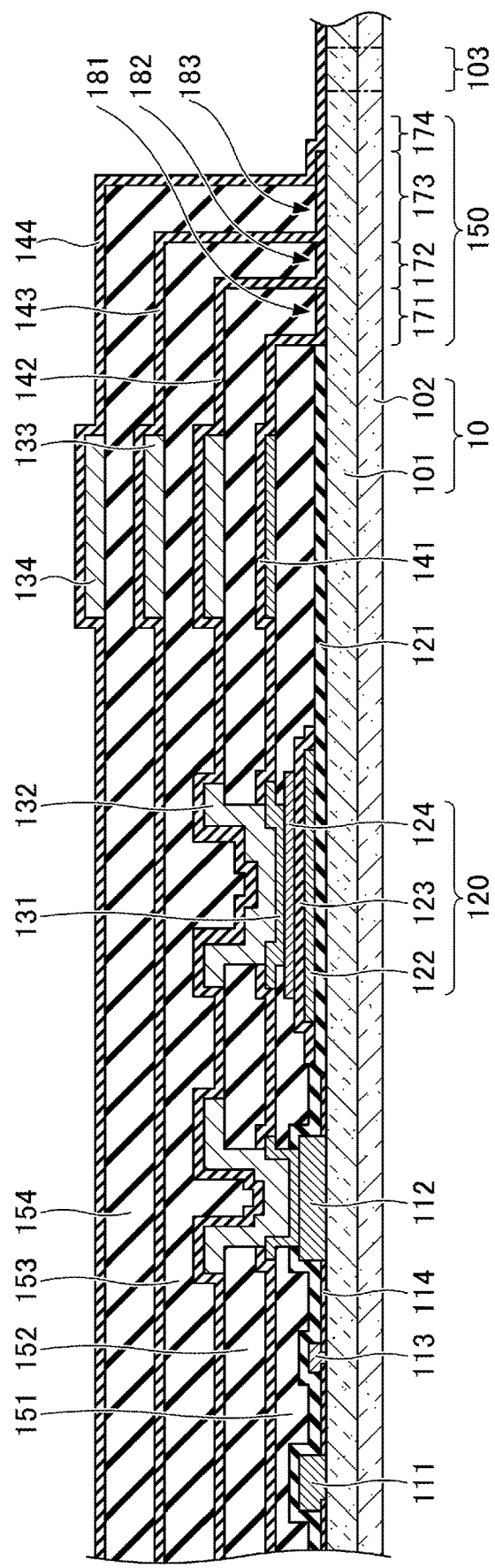
FIG. 7 is a fifth view illustrating the manufacturing process of the semiconductor device according to the first embodiment.

Subsequently, as illustrated in FIG. 7, the second insulating film 154, the fourth wiring layer 134, and the third insulating film 144 are formed. The second insulating film 154 is formed on the surface of the first insulating film 143 by using, for example, spin coating.

Subsequently, the first insulating film 143 is etched together with the second insulating film 154. With this etching, in the end portion 150, the first portion 183 of the first insulating film 143 is formed above the first region 173, and the second insulating film 154 remains above the first portion 183. At this time, the surface of the semiconductor layer 101 is exposed outside of the first region 173 in the end portion 150. Additionally, in this etching, the surface of the third wiring layer 133 is exposed as necessary.

Thereafter, only the second insulating film 154 is selectively etched while leaving the first portion 183. With this etching, the side wall of the second insulating film 154 recedes from the end portion of the first region 173 toward the inner side when viewed from the scribe region 103 (in a direction away from the scribe region 103). As a result, a portion of the first portion 183 protrudes from the side wall of the second insulating film 154 toward the scribe region 103.

In this step, as a first stage, the second insulating film 154 and the first insulating film 143 are etched using a first mask. Thereafter, as a second stage, only the second insulating film 154 is etched using a second mask different from the first mask. That is, in this step, two-stage etching is performed. In the second mask, a region to be masked is receded to the inner side (the side away from the scribe region 103) as compared with the first mask. With the receded mask region, a portion of the first portion 183 that protrudes from the side wall of the second insulating film 154 toward the scribe region 103 is formed.

Here, the first region 173 is outside of the third region 172 on the side where the scribe region 103 is located and is in contact with the third region 172. Additionally, the first insulating film 143 is in contact with the fifth insulating film 142 that is exposed in the end portion of the third region 172.

Thereafter, the fourth wiring layer 134 is formed on the entire surface. The fourth wiring layer 134 is etched except for a portion connected to the third wiring layer 133 and portions used for other wirings and the like.

Subsequently, the third insulating film 144 is formed on the entire surface by using CVD. The third insulating film 144 covers the fourth wiring layer 134, the second insulating film 154, and the outside of the first region 173 of the semiconductor layer 101. At this time, the third insulating film 144 is in contact with the upper surface and the side surface of the portion of the first portion 183 protruding from the side surface of the second insulating film 154. Further, the third insulating film 144 is in contact with the semiconductor layer 101 outside the first region 173 on the side where the scribe region 103 is located.

Figure 8:
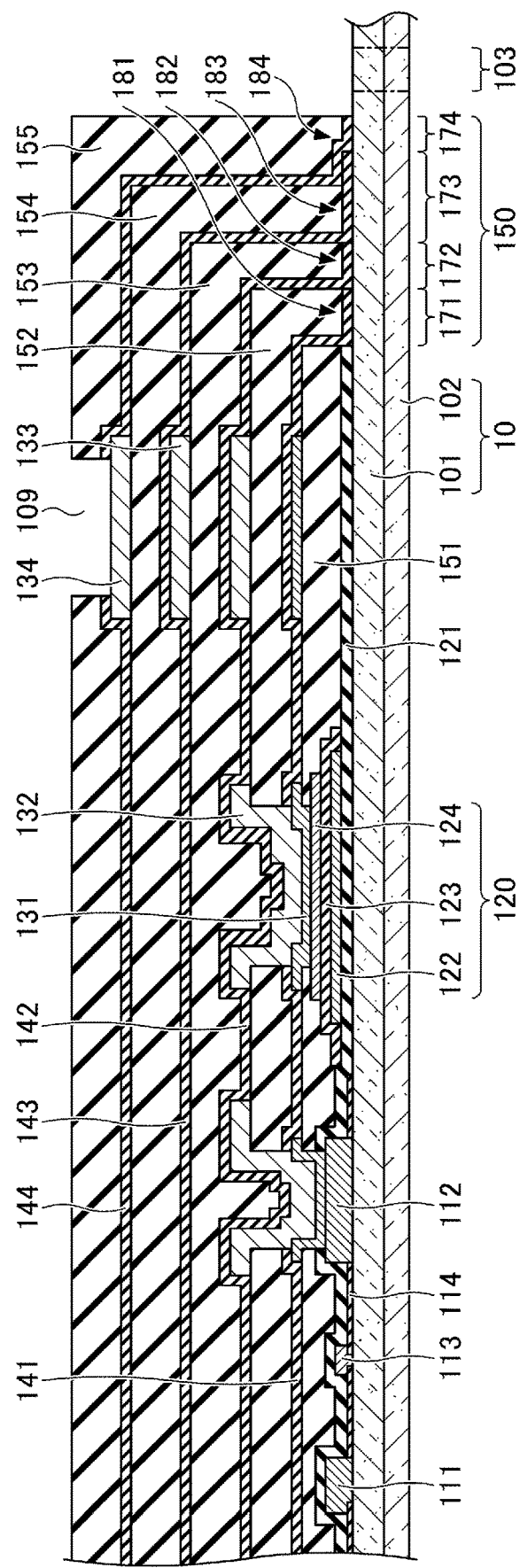
FIG. 8 is a sixth view illustrating the manufacturing process of the semiconductor device according to the first embodiment.

Subsequently, as illustrated in FIG. 8, the ninth insulating film 155 is formed. The ninth insulating film 155 is formed on the surface of the third insulating film 144 by using, for example, spin coating. Subsequently, the third insulating film 144 is etched together with the ninth insulating film 155. With this etching, in the end portion 150, the second portion 184 of the third insulating film 144 and the ninth insulating film 155 remain above the second region 174. At this time, the surface of the semiconductor layer 101 is exposed outside the second region 174 on the side where the scribe region 103 is located.

In this etching, the opening 109 corresponding to the fourth wiring layer 134 is also formed. The opening 109 serves as a pad for electrically connecting the fourth wiring layer 134 to the outside of the semiconductor device 100. The pad is, for example, a bonding pad connected to a bonding wire. The surface of the end of the second portion 184 of the third insulating film 144 is exposed from the ninth insulating film 155.

The manufacturing steps in FIGS. 3 to 8 described thus far are performed in a state of a semiconductor wafer. Therefore, after the step of FIG. 8 is completed, the wafer is cut and divided into the individual semiconductor devices 100, what are called chips, as described below.

Figure 9:
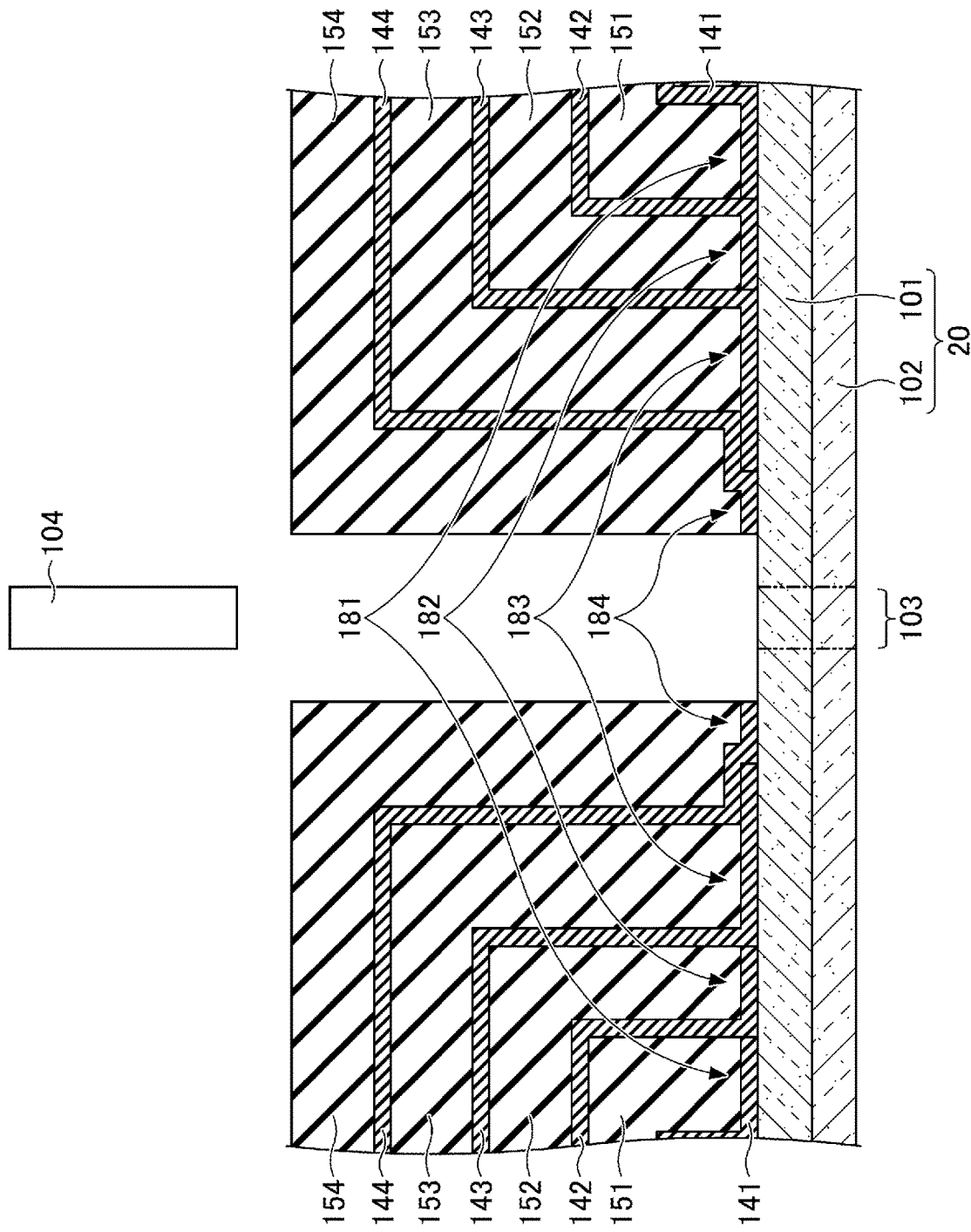
FIG. 9 is a seventh view illustrating the manufacturing process of the semiconductor device according to the first embodiment.

As illustrated in FIG. 9, the scribe region 103 is set on a semiconductor wafer 20 including the semiconductor layer 101 and the substrate 102. The scribe region 103 is a region to be cut by a dicing blade 104.

A gap is formed between the scribe region 103 and the second insulating film 154. The scribe region 103 and the gap are formed such that the total width of the scribe region 103 and the gap is sufficiently larger than the width of the dicing blade 104. As an example, the width of the dicing blade 104 is 50 µm, and the total width of the scribe region 103 and the gap is 100 µm. The reason why the gap is provided is to prevent clogging of the dicing blade 104. The clogging occurs when the dicing blade 104 cuts the second insulating film 154.

Additionally, when the dicing blade 104 comes into contact with the third insulating film 144 and the ninth insulating film 155, cracking or chipping of these films is also prevented. Further, the third insulating film 144 can be also prevented from peeling off from the semiconductor layer 101 due to an impact at the time of cutting.

By cutting the scribe region 103 with the dicing blade 104, multiple individual semiconductor devices 100 are obtained from the semiconductor wafer 20.

As described, the semiconductor device 100 according to the first embodiment can be manufactured.

In the present embodiment, the third insulating film 144 is in contact with the upper surface and the side surface of the portion of the first portion 183 protruding from the second insulating film 154. Further, the second portion 184 of the third insulating film 144 is in contact with the second region 174 of the semiconductor layer 101. Thus, the adhesion of the first insulating film 143 and the third insulating film 144 to the semiconductor layer 101 is improved, thereby improving the resistance to peeling. Therefore, the moisture resistance of the semiconductor device 100 can be improved.

Further, among multiple insulating films (inorganic films) including silicon nitride or silicon oxide, the third insulating film 144, which is the farthest away from the HEMT 110 and the capacitor 120, provides stronger adhesion. Thus, moisture is particularly unlikely to enter the semiconductor device 100. Therefore, excellent moisture resistance is obtained.

In the above-described first embodiment, the semiconductor device having the configuration, in which the outermost third insulating film 144 is in contact with the upper surface and the side surface of the portion of the first portion 183 protruding from the second insulating film 154 and is also in contact with the semiconductor layer 101, has been described. However, the present invention is not limited to this configuration, and the following configuration may be employed. For example, a configuration, in which the fifth insulating film 142 is in contact with the upper surface and the side surface of the portion of the fourth portion 181 protruding from the eighth insulating film 152 and is also in contact with the semiconductor layer 101, may be employed. Additionally, a configuration, in which the first insulating film 143 is in contact with the upper surface and the side surface of the portion of the third portion 182 protruding from the fourth insulating film 153 and is also in contact with the semiconductor layer 101, may be employed.

Second Embodiment

Figure 10:
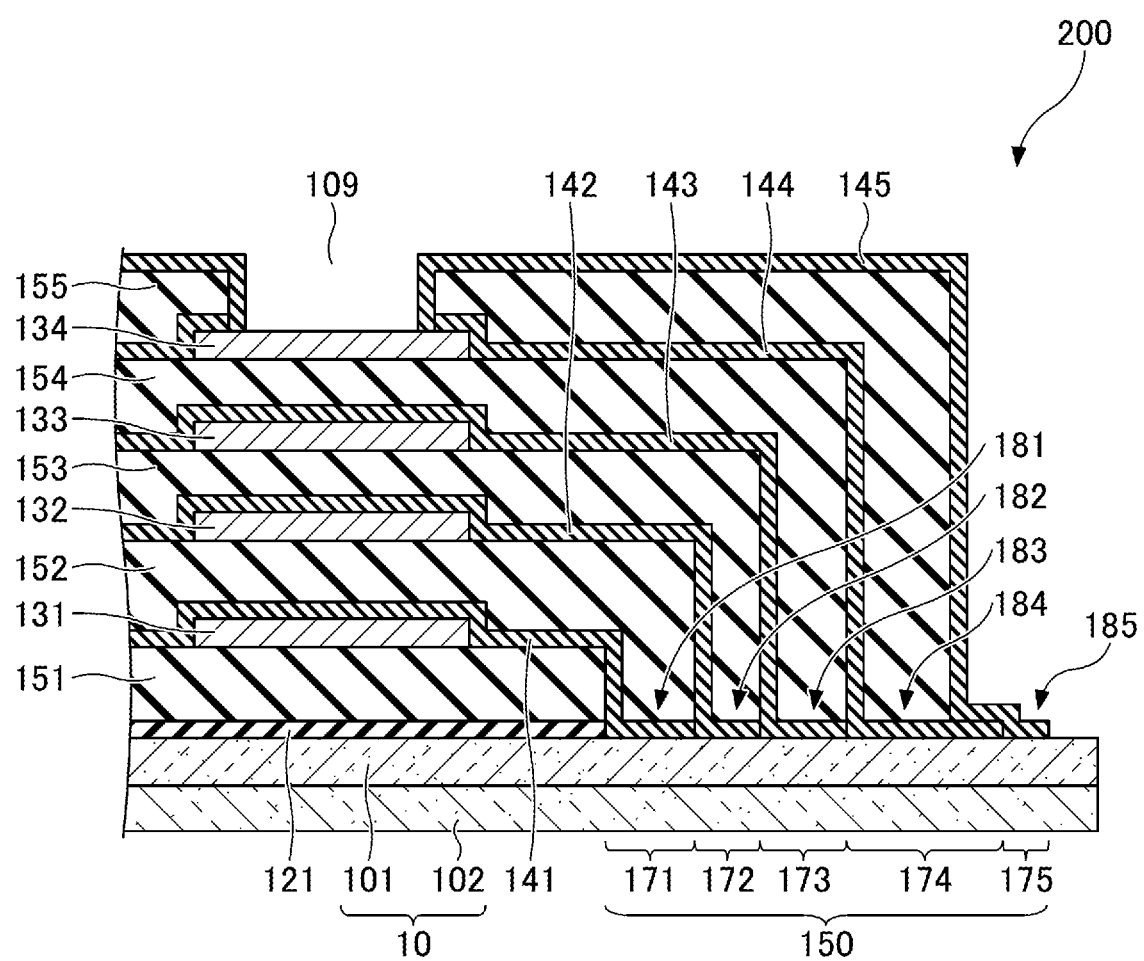
FIG. 10 is a cross-sectional view illustrating a semiconductor device according to a second embodiment.

Next, a second embodiment will be described. The second embodiment relates to a semiconductor device including a HEMT. FIG. 10 is a cross-sectional view illustrating a semiconductor device according to the second embodiment.

A semiconductor device 200 according to the second embodiment is, for example, an MMIC. The semiconductor device 200 is different from the first embodiment in that a tenth insulating film 145 covers the third insulating film 144.

The tenth insulating film 145 is formed to cover the side wall of the opening 109 and the surface of the ninth insulating film 155. The tenth insulating film 145 is formed of, for example, a SiN film or a SiO film. The tenth insulating film 145 is in contact with the second portion 184 of the third insulating film 144 above the second region 174 and is in contact with a fifth region 175 of the semiconductor layer 101.

The manufacturing method of the present embodiment is the same as that of the first embodiment in the steps illustrated in FIGS. 3 to 6. In the following, a manufacturing step following the step of FIG. 6 will be described with reference to FIG. 11, and a step following the step of FIG. 11 will be described with reference to FIG. 12.

Figure 11:
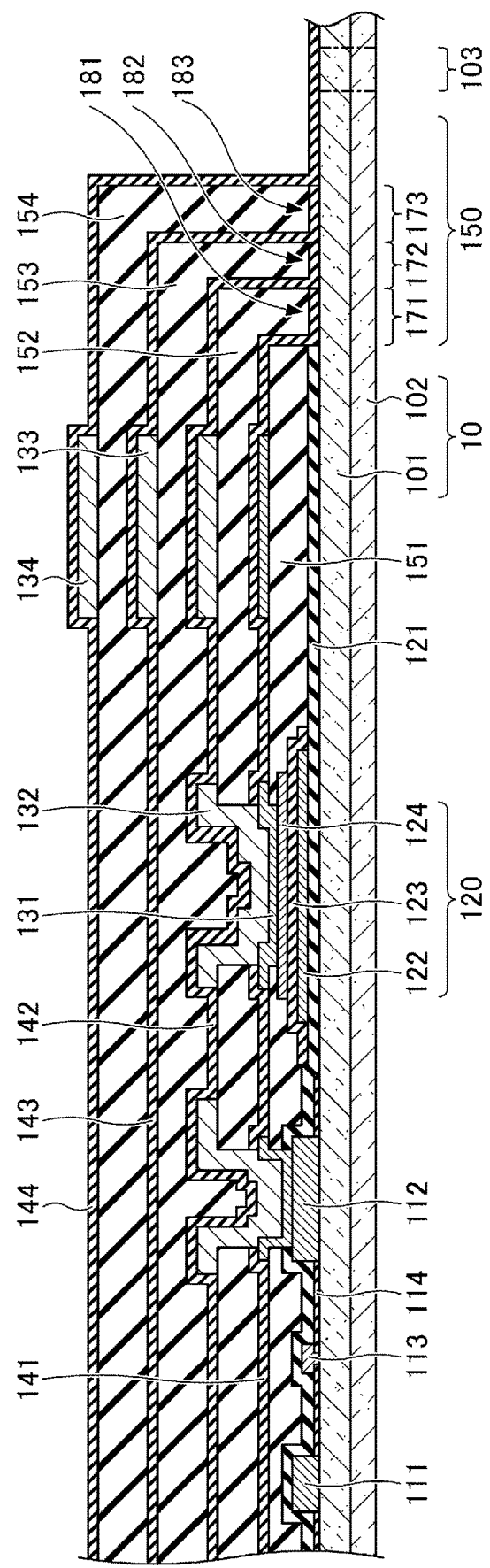
FIG. 11 is a first view illustrating a manufacturing process of the semiconductor device according to the second embodiment.

As illustrated in FIG. 11, the second insulating film 154, the fourth wiring layer 134, and the third insulating film 144 are formed. The second insulating film 154 is formed on the surface of the first insulating film 143 by using, for example, spin coating.

Subsequently, in the end portion 150, the first insulating film 143 is etched together with the second insulating film 154. With this etching, in the end portion 150, the first portion 183 of the first insulating film 143 is formed above the first region 173, and the second insulating film 154 remains above the first portion 183. At this time, the surface of the semiconductor layer 101 is exposed outside the first region 173 in the end portion 150.

Thereafter, the fourth wiring layer 134 is formed on the entire surface. The fourth wiring layer 134 is etched except for a portion connected to the third wiring layer 133 and portions used for other wirings and the like. Subsequently, the third insulating film 144 is formed on the entire surface by using CVD. The third insulating film 144 covers the fourth wiring layer 134, the second insulating film 154, and a portion of the semiconductor layer 101 closer to the scribe region 103 than the first region 173.

Figure 12:
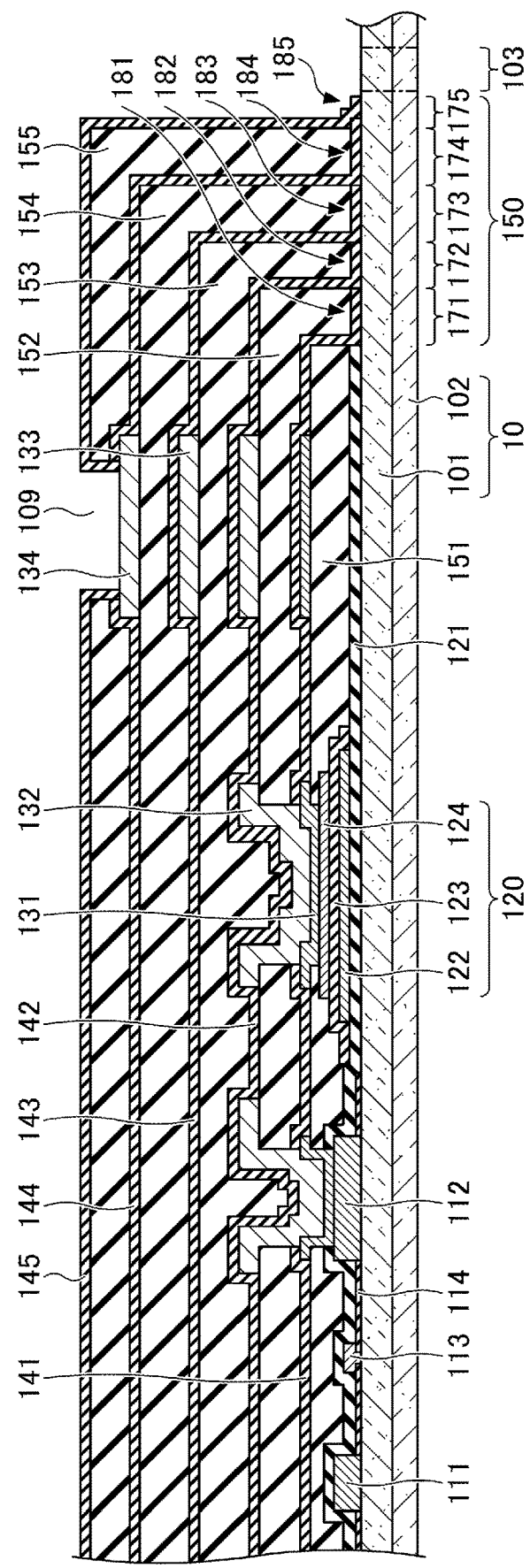
FIG. 12 is a second view illustrating the manufacturing process of the semiconductor device according to the second embodiment.

Subsequently, as illustrated in FIG. 12, the ninth insulating film 155 and the tenth insulating film 145 are formed. The ninth insulating film 155 is formed on the surface of the third insulating film 144 by, using for example, spin coating.

Subsequently, the third insulating film 144 is etched together with the ninth insulating film 155. With this etching, in the end portion 150, the second portion 184 of the third insulating film 144 is formed above the second region 174, and the ninth insulating film 155 remains above the second portion 184. At this time, the surface of the semiconductor layer 101 is exposed outside the second region 174 in the end portion 150. Additionally, in this etching, the opening 109, in which the surface of the fourth wiring layer 134 is exposed, is formed.

Thereafter, only the ninth insulating film 155 is selectively etched while leaving the second portion 184. As a result of this etching, the side wall of the ninth insulating film 155 recedes from the end of the second region 174 toward the inner side when viewed from the scribe region 103 (in the direction away from the scribe region 103). As a result, a portion of the second portion 184 protrudes from the side wall of the ninth insulating film 155 toward the scribe region 103.

In this step, as a first stage, the ninth insulating film 155 and the third insulating film 144 are etched using a third mask. Thereafter, as a second stage, only the ninth insulating film 155 is etched using a fourth mask different from the third mask.

Here, the second region 174 is outside of the first region 173 on the side where the scribe region 103 is located and is in contact with the first region 173. Additionally, the third insulating film 144 is in contact with the first insulating film 143 that is exposed at the end of the first region 173.

Subsequently, the tenth insulating film 145 is formed on the entire surface by using CVD. The tenth insulating film 145 covers the fourth wiring layer 134, the ninth insulating film 155, and the outside of the second region 174 of the semiconductor layer 101. At this time, the tenth insulating film 145 is in contact with the upper surface and the side surface of the portion of the second portion 184 protruding from the side surface of the ninth insulating film 155. Further, the tenth insulating film 145 is in contact with the semiconductor layer 101 outside the second region 174 on the side where the scribe region 103 is located.

Subsequently, the tenth insulating film 145 is etched to leave a fifth portion 185 of the tenth insulating film 145 above the fifth region 175. At this time, the surface of the semiconductor layer 101 is exposed at a position closer to the scribe region 103 than the fifth region 175. In this etching, the surface of the fourth wiring layer 134 is also exposed in the opening 109, and the tenth insulating film 145 remains on the side wall of the opening 109.

Finally, as in the first embodiment, the scribe region 103 is cut by the dicing blade 104 to obtain the multiple individual semiconductor devices 200.

As described, the semiconductor device 200 according to the second embodiment can be manufactured.

In the present embodiment, the tenth insulating film 145 is in contact with the upper surface and the side surface of the portion of the second portion 184 of the third insulating film 144 protruding from the ninth insulating film 155, and is also in contact with the semiconductor layer 101. Therefore, similarly with the first embodiment, peeling of the third insulating film 144 and the tenth insulating film 145 can be suppressed. Furthermore, the number of films through which moisture is less likely to pass is increased, thereby further suppressing entry of moisture into the semiconductor device 200.

Therefore, in the second embodiment, the moisture resistance of the semiconductor device 200 can be improved more than that in in the first embodiment.

Additionally, because the film covering the side wall of the opening 109 is used as the tenth insulating film 145, the number of steps is not increased.

Third Embodiment

Figure 13:
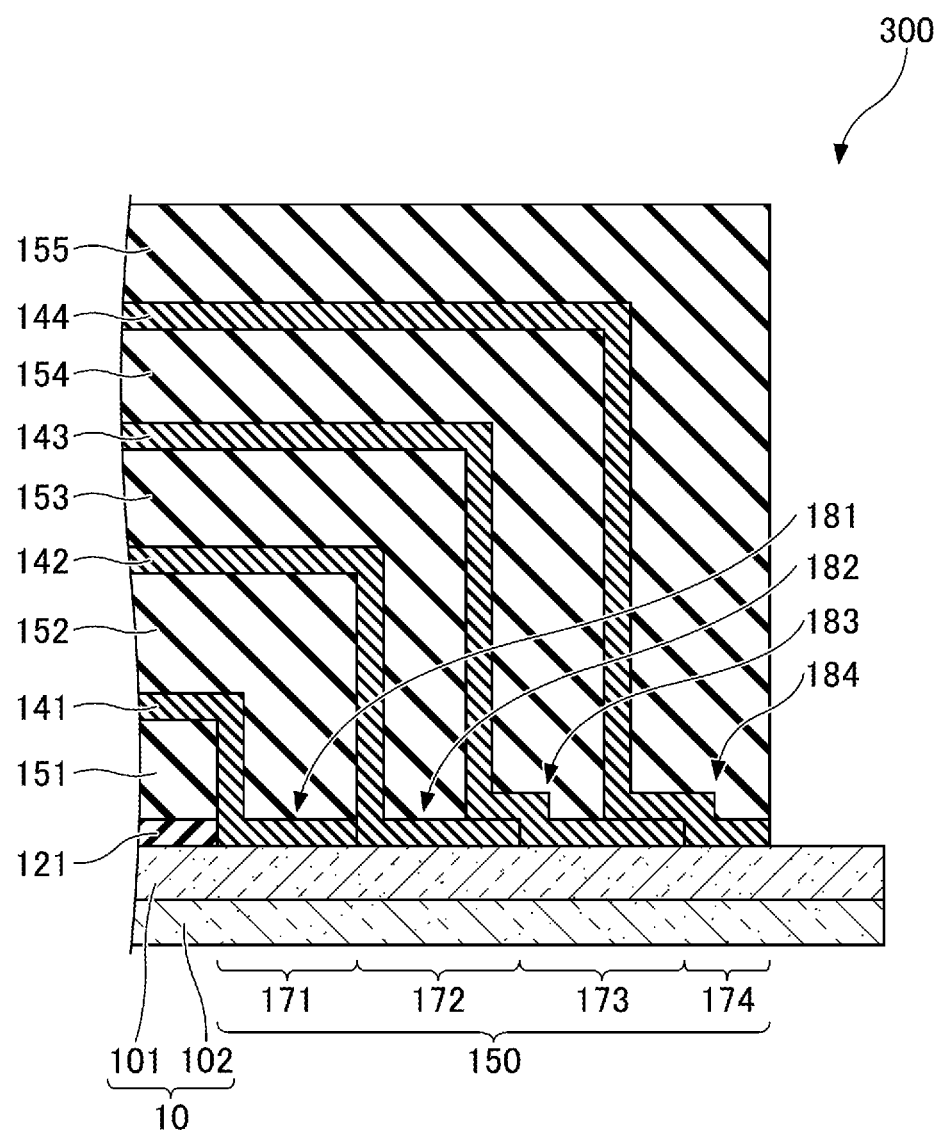
FIG. 13 is a cross-sectional view illustrating a semiconductor device according to a third embodiment.

Next, a third embodiment will be described. The third embodiment relates to a semiconductor device including a HEMT. FIG. 13 is a cross-sectional view illustrating a semiconductor device according to the third embodiment.

A semiconductor device 300 according to the third embodiment is, for example, an MMIC. The semiconductor device 300 is different from the first embodiment in that the first insulating film 143 is in contact with the upper surface and the side surface of the third portion 182 of the fifth insulating film 142 over the third region 172.

Specifically, the first insulating film 143 has a portion that is in contact with the upper surface and the side surface of the portion of the third portion 182 protruding from the fourth insulating film 153 toward the outer edge of the semiconductor substrate 10, and the first portion 183 that is in contact with the first region 173 of the semiconductor layer 101.

The manufacturing method of the present embodiment is the same as that of the first embodiment in the steps illustrated in FIGS. 3 to 5. In the following, a manufacturing step following the step of FIG. 5 will be described with reference to FIG. 14, a step following the step of FIG. 14 will be described with reference to FIG. 15, and a step following the step of FIG. 15 will be described with reference to FIG. 16.

Figure 14:
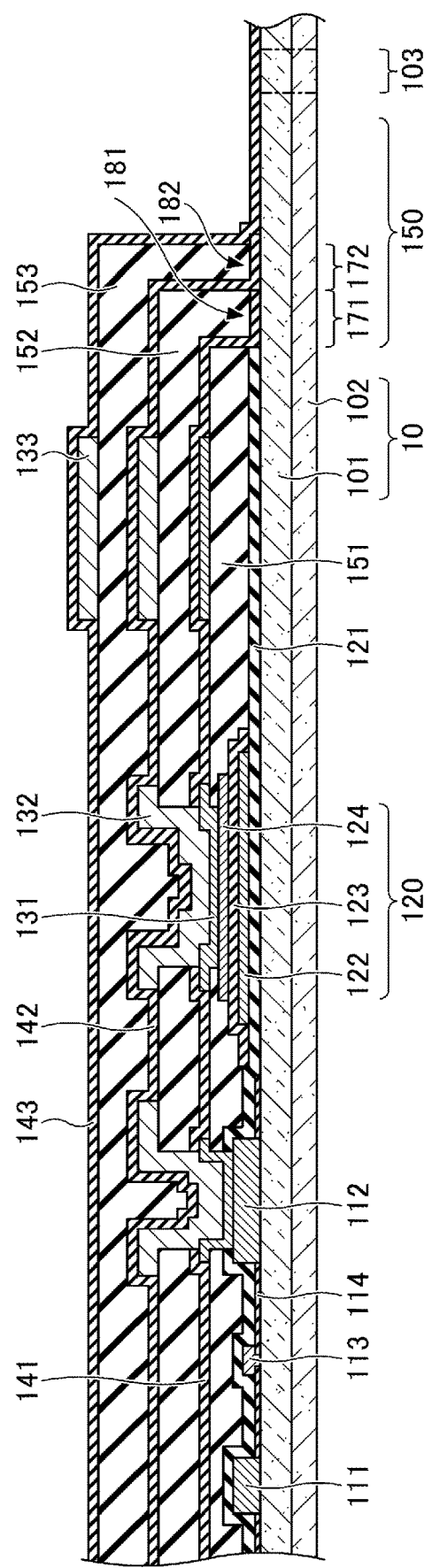
FIG. 14 is a first view illustrating a manufacturing process of the semiconductor device according to the third embodiment.

As illustrated in FIG. 14, the fourth insulating film 153, the third wiring layer 133, and the first insulating film 143 are formed. The fourth insulating film 153 is formed on the surface of the fifth insulating film 142 by using, for example, spin coating.

Subsequently, the fifth insulating film 142 is etched together with the fourth insulating film 153. With this etching, in the end portion 150, the third portion 182 of the fifth insulating film 142 is formed above the third region 172, and the fourth insulating film 153 remains above the third portion 182. At this time, the surface of the semiconductor layer 101 is exposed outside the third region 172 in the end portion 150. In this etching, the surface of the second wiring layer 132 is exposed as necessary.

Thereafter, only the fourth insulating film 153 is selectively etched while leaving the third portion 182. As a result of this etching, the side wall of the fourth insulating film 153 recedes from the end of the third region 172 toward the inner side when viewed from the scribe region 103 (in the direction away from the scribe region 103). As a result, a portion of the third portion 182 protrudes from the side wall of the fourth insulating film 153 toward the scribe region 103.

In this step, as a first stage, the fourth insulating film 153 and the fifth insulating film 142 are etched using a fifth mask. Thereafter, as a second stage, only the fourth insulating film 153 is etched using a sixth mask different from the fifth mask.

Thereafter, the third wiring layer 133 is formed on the entire surface. The third wiring layer 133 is etched except for a portion connected to the second wiring layer 132 and portions used for other wirings and the like.

Subsequently, the first insulating film 143 is formed on the entire surface by using CVD. The first insulating film 143 covers the third wiring layer 133, the fourth insulating film 153, and the outside of the third region 172 of the semiconductor layer 101. At this time, the first insulating film 143 is in contact with the upper surface and the side surface of the portion of the third portion 182 protruding from the side surface of the fourth insulating film 153, and is also in contact with the surface of the semiconductor layer 101 at a position closer to the scribe region 103 than the third region 172.

Figure 15:
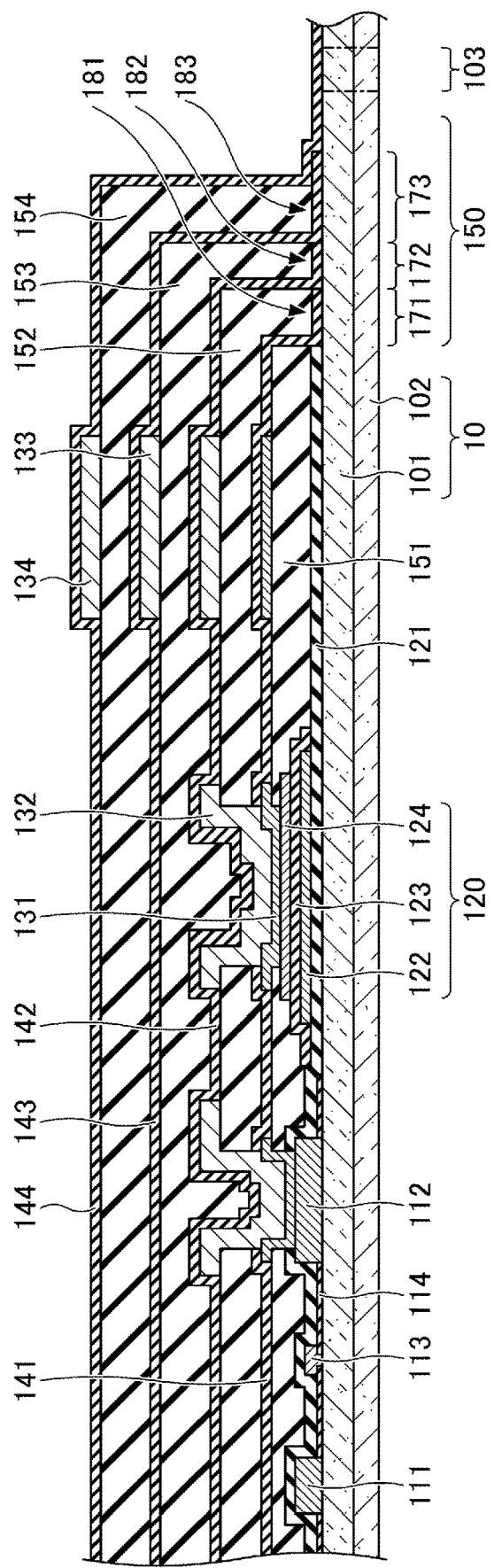
FIG. 15 is a second view illustrating the manufacturing process of the semiconductor device according to the third embodiment.

Subsequently, as illustrated in FIG. 15, the second insulating film 154, the fourth wiring layer 134, and the third insulating film 144 are formed. The second insulating film 154 is formed on the surface of the first insulating film 143 by using, for example, spin coating.

Subsequently, the first insulating film 143 is etched together with the second insulating film 154. With this etching, in the end portion 150, the first portion 183 of the first insulating film 143 is formed above the first region 173, and the second insulating film 154 remains above the first portion 183. At this time, the surface of the semiconductor layer 101 is exposed outside the first region 173 in the end portion 150. In this etching, the surface of the third wiring layer 133 is exposed as necessary.

Thereafter, only the second insulating film 154 is selectively etched while leaving the first portion 183. As a result of this etching, the side wall of the second insulating film 154 recedes from the end of the first region 173 toward the inner side when viewed from the scribe region 103 (in the direction away from the scribe region 103). As a result, a portion of the first portion 183 protrudes from the side wall of the second insulating film 154 toward the scribe region 103.

In this step, as a first stage, the second insulating film 154 and the first insulating film 143 are etched using a seventh mask. Thereafter, as a second stage, only the second insulating film 154 is etched using an eighth mask different from the seventh mask.

Thereafter, the fourth wiring layer 134 is formed on the entire surface. The fourth wiring layer 134 is etched except for a portion connected to the third wiring layer 133 and portions used for other wirings and the like. Subsequently, the third insulating film 144 is formed on the entire surface by using CVD. The third insulating film 144 covers the fourth wiring layer 134, the second insulating film 154, and a portion of the semiconductor layer 101 closer to the scribe region 103 than the first region 173. At this time, the third insulating film 144 is in contact with the upper surface and the side surface of the portion of the first portion 183 protruding from the side surface of the second insulating film 154, and is also in contact with the surface of the semiconductor layer 101 outside the first region 173.

Figure 16:
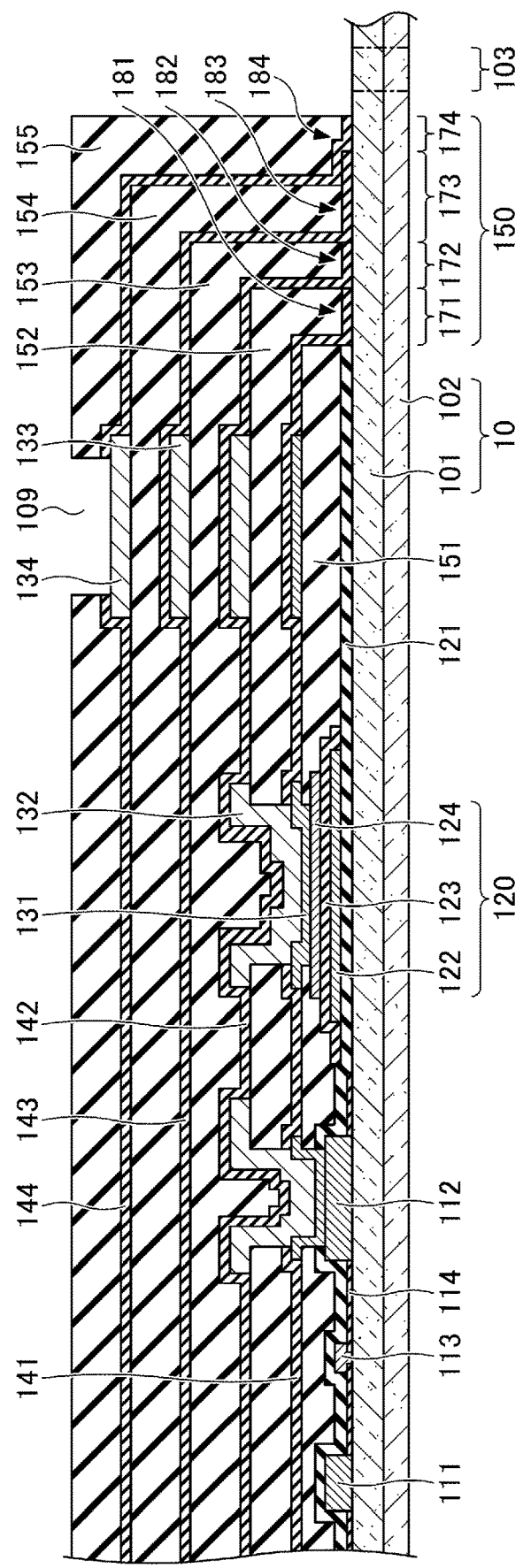
FIG. 16 is a third view illustrating the manufacturing process of the semiconductor device according to the third embodiment.

Subsequently, as illustrated in FIG. 16, the ninth insulating film 155 is formed. Specifically, the ninth insulating film 155 is formed on the surface of the third insulating film 144 by using, for example, spin coating.

Subsequently, the third insulating film 144 is etched together with the ninth insulating film 155. With this etching, in the end portion 150, the second portion 184 of the third insulating film 144 is formed above the second region 174, and the ninth insulating film 155 remains above the second portion 184. At this time, the semiconductor layer 101 is exposed outside the second region 174 in the end portion 150. Additionally, in this etching, the opening 109, in which the surface of the fourth wiring layer 134 is exposed, is also formed.

Finally, as in the other embodiments, the scribe region 103 is cut by the dicing blade 104 to obtain the multiple individual semiconductor devices 300.

As described, the semiconductor device 300 according to the third embodiment can be manufactured.

According to the present embodiment, in the end portion 150, the first insulating film 143 is in contact with the upper surface and the side surface of the portion of the third portion 182 protruding from the fourth insulating film 153 and is also in contact with the semiconductor layer 101. Thus, the first insulating film 143 does not tend to peel off from the semiconductor substrate 10, further. Therefore, the semiconductor device 300 becomes more resistant to entry of moisture, thereby improving the moisture resistance of the semiconductor device 300.

In the present embodiment, the fifth insulating film 142 may be further in contact with the upper surface and the side surface of the fourth portion 181 and may be also in contact with the semiconductor layer 101. Further, in this case, the fifth insulating film 142 also does not tend to peel off from the semiconductor substrate 10. Therefore, the moisture resistance of the semiconductor device 300 can be further improved.

Fourth Embodiment

Figure 17:
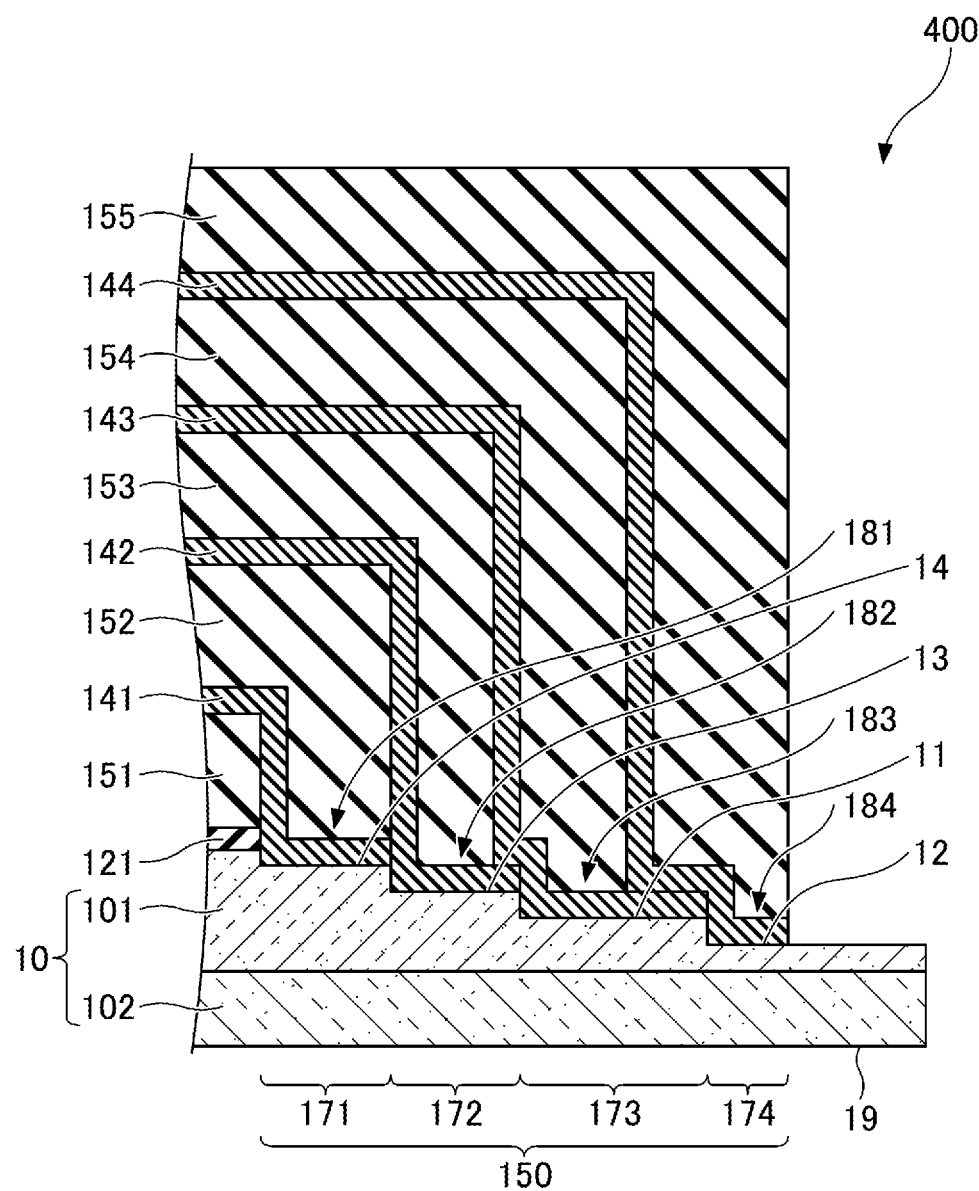
FIG. 17 is a cross-sectional view illustrating a semiconductor device according to a fourth embodiment.

Next, a fourth embodiment will be described. The fourth embodiment relates to a semiconductor device including a HEMT. FIG. 17 is a cross-sectional view illustrating a semiconductor device according to the fourth embodiment.

A semiconductor device 400 according to the fourth embodiment is, for example, an MMIC. The semiconductor device 400 is different from the first embodiment in that the semiconductor layer 101 is etched in the end portion 150 to form multiple planes having different heights. The fourth region 171, the third region 172, the first region 173, and the second region 174 are formed such that the thickness of the semiconductor layer 101 decreases in this order. Therefore, the fourth region 171, the third region 172, the first region 173, and the second region 174 have planes in which the outer regions are lower than the inner regions.

Here, an enlarged view of the semiconductor substrate 10 in the semiconductor device according to the fourth embodiment will be described with reference to FIG. 18.

Figure 18:
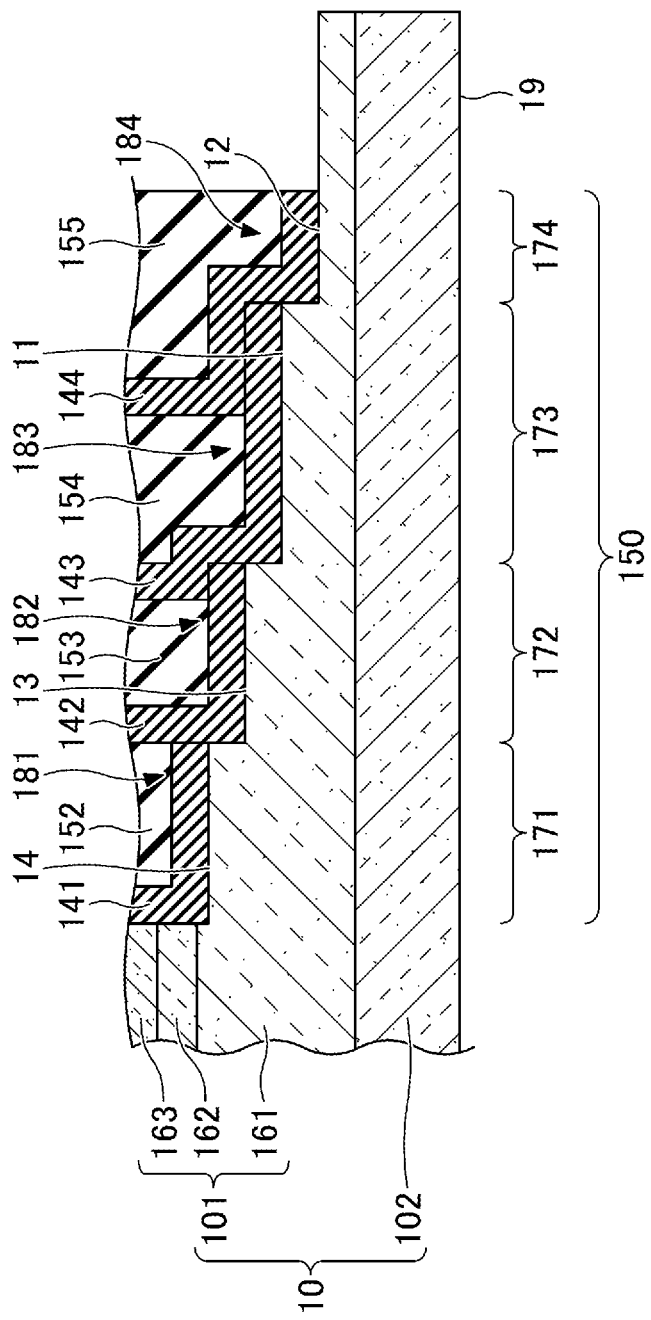
FIG. 18 is an enlarged view of the semiconductor substrate according to the fourth embodiment.

As illustrated in FIG. 18, each of the fourth region 171, the third region 172, the first region 173 region, and the second region 174 has a plane formed by being etched through the channel layer 162 and the electron supply layer 163 to the buffer layer 161. The fourth region 171 has a fourth plane 14 lower than the surface of the buffer layer 161 before being etched. The third region 172 has a third plane 13 lower than the fourth plane 14. The first region 173 has a first plane 11 lower than the third plane 13. The second region 174 has a second plane 12 lower than the first plane 11. The second plane 12 is closer to a lower surface 19 of the semiconductor substrate than the first plane 11. Here, the reason why the semiconductor layer 101 is etched to the buffer layer 161 is to have no influence on the characteristics of the HEMT 110.

The manufacturing method of the present embodiment is the same as that of the first embodiment in the step illustrated in FIG. 3. In the following, a manufacturing step following the step of FIG. 3 will be described with reference to FIG. 19, and a step following the step of FIG. 19 will be described with reference to FIG. 20. Similarly, a step following the step of FIG. 20 will be described with reference to FIG. 21, a step following the step of FIG. 21 will be described with reference to FIG. 22, and a step following the step of FIG. 22 will be described with reference to FIG. 23.

Figure 19:
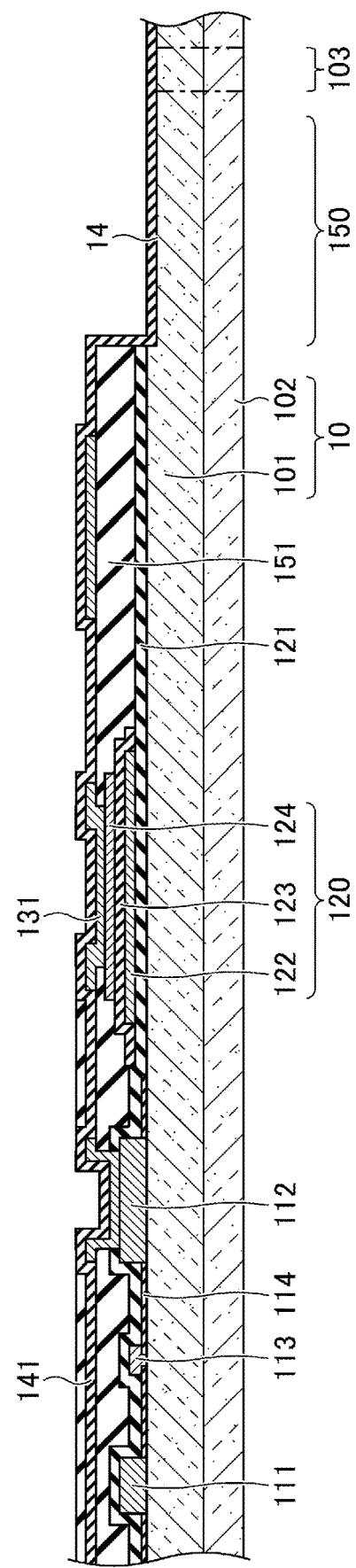
FIG. 19 is a first view illustrating the manufacturing process of the semiconductor device according to the fourth embodiment.

As illustrated in FIG. 19, the sixth insulating film 151, the first wiring layer 131, and the seventh insulating film 141 are formed. The sixth insulating film 151 is formed on the entire surface by using, for example, spin coating. The sixth insulating film 151 covers the upper electrode 124, the dielectric film 123, and the insulating film 121.

Subsequently, the sixth insulating film 151 is etched together with the insulating film 121, so that the semiconductor layer 101 is exposed in the end portion 150. At this time, the semiconductor layer 101 is etched to the buffer layer 161. With this etching, the fourth plane 14 lower than the surface of the semiconductor layer 101 before being etched is formed in the buffer layer 161 in the end portion 150. In this etching, the surfaces of the drain electrode 112 and the upper electrode 124 are also exposed.

Thereafter, the first wiring layer 131 is formed on the entire surface. The first wiring layer 131 is etched except for portions used for the drain electrode 112, the upper electrode 124, other wirings, and the like. With this etching, the first wiring layer 131 connected to the drain electrode 112 and the first wiring layer 131 connected to the upper electrode 124 are formed. Subsequently, the seventh insulating film 141 is formed on the entire surface by using CVD. The seventh insulating film 141 covers the first wiring layer 131, the sixth insulating film 151, and the semiconductor layer 101 of the end portion 150.

Figure 20:
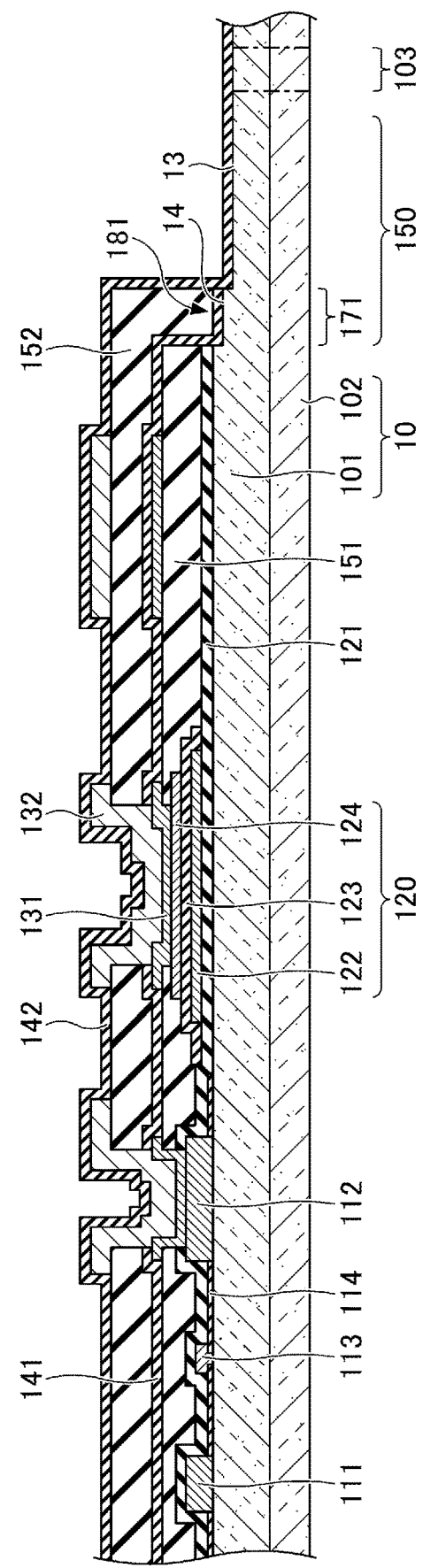
FIG. 20 is a second view illustrating the manufacturing process of the semiconductor device according to the fourth embodiment.

Subsequently, as illustrated in FIG. 20, the eighth insulating film 152, the second wiring layer 132, and the fifth insulating film 142 are formed. The eighth insulating film 152 is formed on the surface of the seventh insulating film 141 by using, for example, spin coating.

Subsequently, the seventh insulating film 141 is etched together with the eighth insulating film 152. With this etching, in the end portion 150, the fourth portion 181 of the seventh insulating film 141 is formed above the fourth region 171, and the eighth insulating film 152 remains above the fourth portion 181. At this time, the buffer layer 161 is further etched outside the fourth region 171. With this etching, the third plane 13 lower than the fourth plane 14 of the fourth region 171 is formed in the buffer layer 161 outside the fourth region 171. In this etching, the surface of the first wiring layer 131 is also exposed.

Thereafter, the second wiring layer 132 is formed on the entire surface. The second wiring layer 132 is etched except for a portion connected to the first wiring layer 131 and portions used for other wirings and the like. Subsequently, the fifth insulating film 142 is formed on the entire surface by using CVD. The fifth insulating film 142 covers the second wiring layer 132, the eighth insulating film 152, and a portion of the semiconductor layer 101 closer to the scribe region 103 than the fourth region 171.

Figure 21:
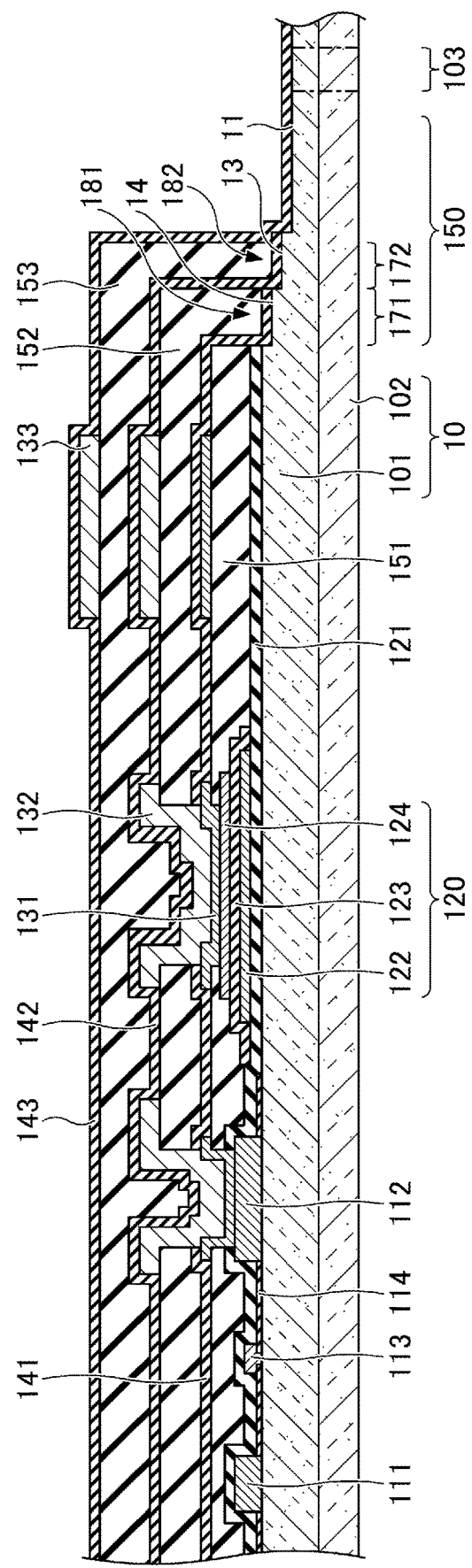
FIG. 21 is a third view illustrating the manufacturing process of the semiconductor device according to the fourth embodiment.

Subsequently, as illustrated in FIG. 21, the fourth insulating film 153, the third wiring layer 133, and the first insulating film 143 are formed. The fourth insulating film 153 is formed on the surface of the fifth insulating film 142 by using, for example, spin coating.

Subsequently, the fifth insulating film 142 is etched together with the fourth insulating film 153. With this etching, in the end portion 150, the third portion 182 of the fifth insulating film 142 is formed above the third region 172, and the fourth insulating film 153 remains above the third portion 182. At this time, the buffer layer 161 is further etched outside the third region 172. With this etching, the first plane 11 lower than the third plane 13 of the third region 172 is formed in the buffer layer 161 outside the third region 172. In this etching, the surface of the second wiring layer 132 is exposed as necessary.

Thereafter, only the fourth insulating film 153 is selectively etched while leaving the third portion 182. As a result of this etching, the side wall of the fourth insulating film 153 recedes from the end of the third region 172 to the inner side when viewed from the scribe region 103 (the direction away from the scribe region 103). As a result, a portion of the third portion 182 protrudes from the side wall of the fourth insulating film 153 toward the scribe region 103.

In this step, as a first stage, the fourth insulating film 153 and the fifth insulating film 142 are etched using a ninth mask. Thereafter, as a second stage, only the fourth insulating film 153 is etched using a tenth mask different from the ninth mask.

Thereafter, the third wiring layer 133 is formed on the entire surface. The third wiring layer 133 is etched except for a portion that is in contact with the second wiring layer 132 and portions used for other wirings and the like. Subsequently, the first insulating film 143 is formed on the entire surface by using CVD. The first insulating film 143 covers the third wiring layer, the fourth insulating film 153, and a portion of the semiconductor layer 101 closer to the scribe region 103 than the third region 172. At this time, the first insulating film 143 is in contact with the upper surface and the side surface of the portion of the third portion 182 protruding from the side surface of the fourth insulating film 153, and is also in contact with the surface of the buffer layer 161 outside the third region 172.

Figure 22:
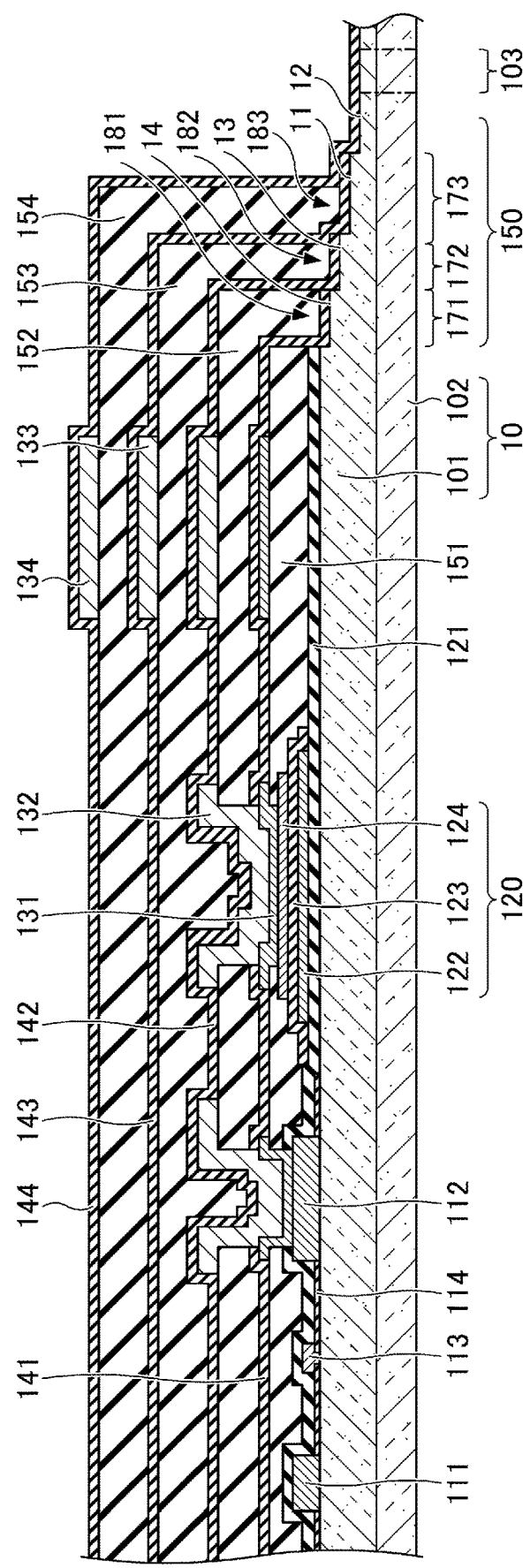
FIG. 22 is a fourth view illustrating the manufacturing process of the semiconductor device according to the fourth embodiment.

Subsequently, as illustrated in FIG. 22, the second insulating film 154, the fourth wiring layer 134, and the third insulating film 144 are formed. The second insulating film 154 is formed on the surface of the first insulating film 143 by using, for example, spin coating.

Subsequently, the first insulating film 143 is etched together with the second insulating film 154. With this etching, in the end portion 150, the first portion 183 of the first insulating film 143 is formed above the first region 173, and the second insulating film 154 remains above the first portion 183. At this time, the buffer layer 161 is further etched outside the first region 173 in the end portion 150. With this etching, the second plane 12 lower than the first plane 11 of the first region 173 is formed in the buffer layer 161 outside the first region 173. In this etching, the surface of the third wiring layer 133 is exposed as necessary.

Thereafter, only the second insulating film 154 is selectively etched. As a result of this etching, the side wall of the second insulating film 154 recedes from the end of the first region 173 toward the inner side when viewed from the scribe region 103 (in the direction away from the scribe region 103). As a result, a portion of the first portion 183 protrudes from the side wall of the second insulating film 154 toward the scribe region 103.

In this step, as a first stage, the second insulating film 154 and the first insulating film 143 are etched using an eleventh mask. Thereafter, as a second stage, only the second insulating film 154 is etched using a twelfth mask different from the eleventh mask.

Thereafter, the fourth wiring layer 134 is formed on the entire surface. The fourth wiring layer 134 is etched except for a portion connected to the third wiring layer 133 and portions used for other wirings and the like. Subsequently, the third insulating film 144 is formed on the entire surface by using CVD. The third insulating film 144 covers the fourth wiring layer 134, the second insulating film 154, and a portion of the semiconductor layer 101 closer to the scribe region 103 than the first region 173. At this time, the third insulating film 144 is in contact with the upper surface and the side surface of the portion of the first portion 183 protruding from the side surface of the second insulating film 154, and is also in contact with the surface of the buffer layer 161 outside the first region 173.

Figure 23:
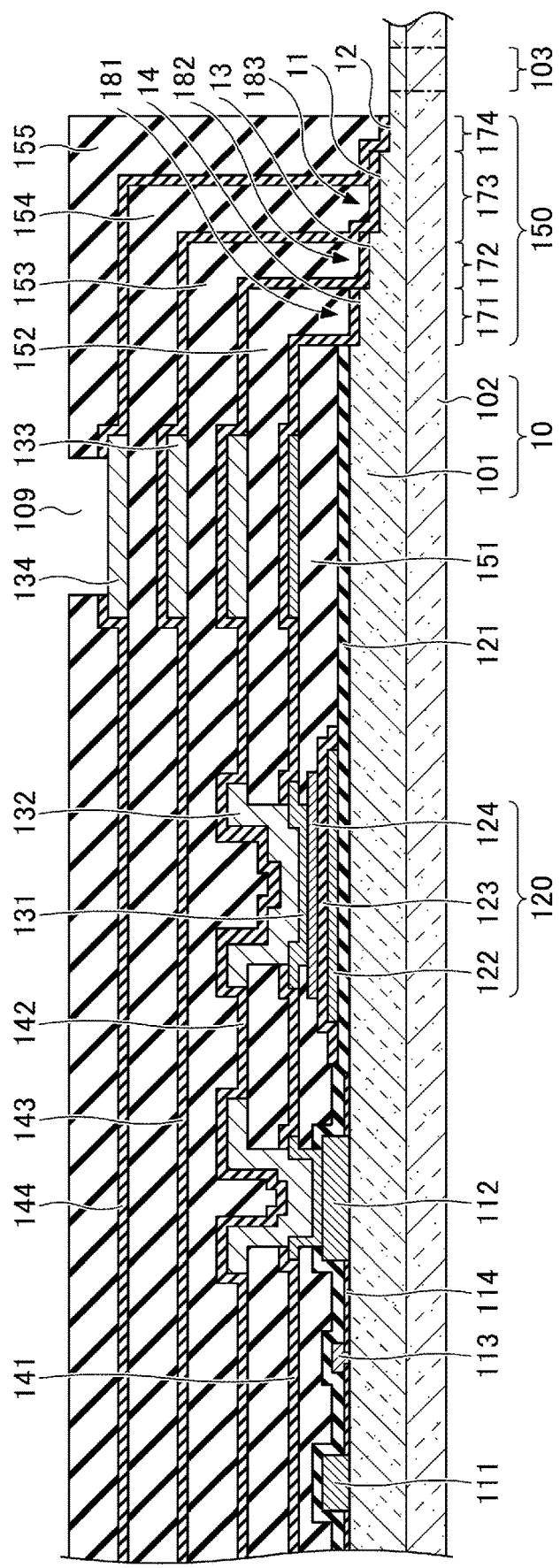
FIG. 23 is a fifth view illustrating the manufacturing process of the semiconductor device according to the fourth embodiment.

Subsequently, as illustrated in FIG. 23, the ninth insulating film 155 is formed. Specifically, the ninth insulating film 155 is formed on the surface of the third insulating film 144 by using, for example, spin coating.

Subsequently, the third insulating film 144 is etched together with the ninth insulating film 155. With this etching, in the end portion 150, the second portion 184 of the third insulating film 144 is formed above the second region 174, and the ninth insulating film 155 remains above the second portion 184. At this time, the buffer layer 161 having the same plane as the plane of the second region 174 is exposed outside the second region 174 in the end portion 150.

In this etching, the opening 109 corresponding to the fourth wiring layer 134 is also formed. Further, the side surface of the end of the second portion 184 of the third insulating film 144 is exposed from the ninth insulating film 155.

Finally, as in the other embodiments, the scribe region 103 is cut by the dicing blade 104 to obtain the multiple individual semiconductor devices 400.

As described, the semiconductor device 400 according to the fourth embodiment can be manufactured.

In the present embodiment, the fourth plane 14, the third plane 13, the first plane 11, and the second plane 12 having different heights are formed on the semiconductor substrate 10. Thus, steps are present on the upper surface of the semiconductor substrate 10. Thus, the seventh insulating film 141, the fifth insulating film 142, the first insulating film 143, and the third insulating film 144 are in contact with not only the upper surface of the semiconductor substrate 10 but also the wall surfaces of the steps. Thus, the contact area of the seventh insulating film 141, the fifth insulating film 142, the first insulating film 143, and the third insulating film 144 with the semiconductor substrate 10 becomes larger, and stronger adhesion is obtained. Therefore, according to the fourth embodiment, further excellent moisture resistance can be obtained.

Furthermore, because there are steps between the fourth plane 14, the third plane 13, the first plane 11, and the second plane 12, the distance over which moisture enters and travels from the outside of the semiconductor device 400 to the inside thereof is increased. The moisture resistance of the semiconductor device 400 can be improved by increasing the distance over which moisture enters and travels.

Fifth Embodiment

Figure 24:
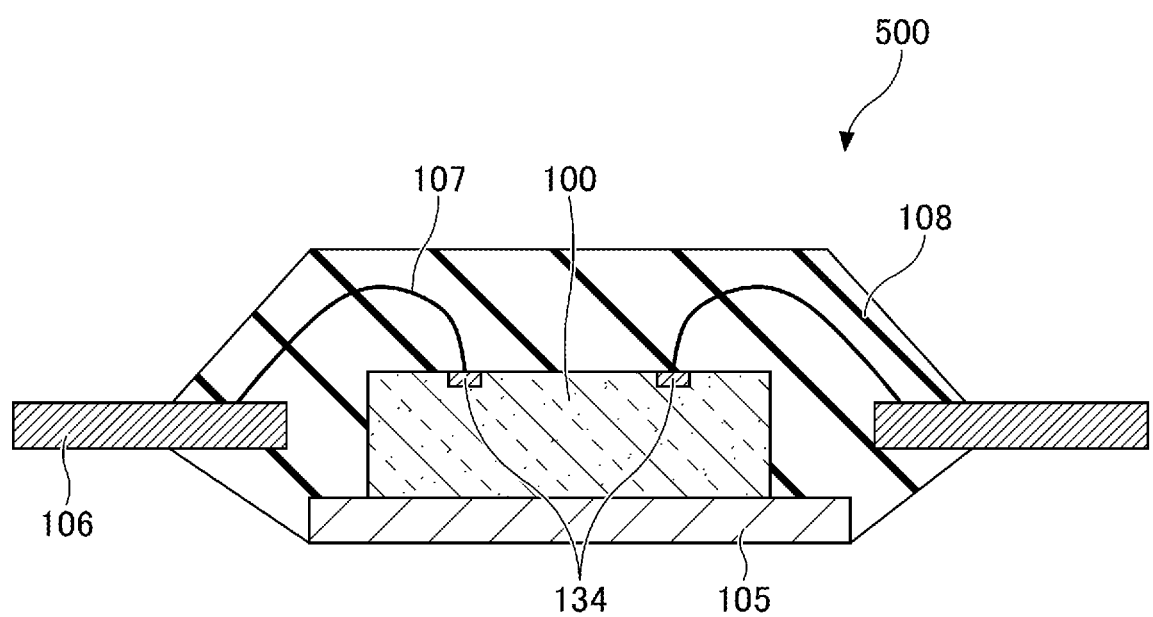
FIG. 24 is a cross-sectional view illustrating a semiconductor package according to a fifth embodiment.

Next, a fifth embodiment will be described. The fifth embodiment relates to a semiconductor package. FIG. 24 is a cross-sectional view illustrating a semiconductor package according to the fifth embodiment.

A semiconductor package 500 according to the fifth embodiment includes the semiconductor device 100 according to the first embodiment, a die pad 105, leads 106, bonding wires 107, and a mold resin 108.

The semiconductor device 100 is fixed on the die pad 105 by using an adhesive, for example, a die attach film or a die attach paste.

The bonding wire 107 electrically connects the bonding pad formed by the fourth wiring layer 134 to the lead 106. The lead 106 and the die pad 105 are formed of metal, for example.

The mold resin 108 covers the semiconductor device 100, the bonding wire 107, a portion of the die pad 105 excluding the back surface thereof, and portions of the leads 106. The mold resin 108 is, for example, a plastic mold resin.

Although the back surface of the die pad 105 is exposed from the mold resin 108 to dissipate heat from the semiconductor device 100, the back surface may be covered with the mold resin 108.

Here, although the semiconductor device in which multiple semiconductor elements are formed on one chip has been described as the semiconductor device 100 in the present embodiment, the semiconductor elements may be divided into multiple semiconductor devices. In this case, the multiple semiconductor devices are fixed on the die pad 105 through an adhesive.

Additionally, although the present embodiment has been described using the semiconductor device 100, any one of the semiconductor devices 200, 300, and 400 may be used.

As described above, in the fifth embodiment, because the semiconductor devices 100, 200, 300, and 400 having improved the moisture resistance are used, a semiconductor package having high moisture resistance can be provided even if a mold resin that easily allows moisture to pass is used.

Although the embodiments and the like have been described in detail above, the present invention is not limited to the above-described embodiments and the like, and various modifications and substitutions can be added to the above-described embodiments and the like without departing from the scope described in the claims.

What is claimed is:

1. A semiconductor device comprising:
    a semiconductor substrate;
    a semiconductor element formed on the semiconductor substrate;
    a first insulating film covering the semiconductor element;
    a second insulating film formed on the first insulating film; and
    a third insulating film formed on the second insulating film;
    wherein the first insulating film and the third insulating film allow less moisture to pass than the second insulating film,
    wherein a dielectric constant of the second insulating film is lower than a dielectric constant of the first insulating film and a dielectric constant of the third insulating film,
    wherein the first insulating film has a first portion that is in contact with a first region of an upper surface of the semiconductor substrate,
    wherein the third insulating film has a second portion that is in contact with an upper surface and a side surface of the first portion and that is in contact with a second region of the upper surface of the semiconductor substrate, the second region being farther away from the semiconductor element than the first region.

2. The semiconductor device as claimed in claim 1, wherein the first insulating film and the third insulating film include silicon nitride or silicon oxide, and the second insulating film includes polyimide.

3. The semiconductor device as claimed in claim 1,
    wherein the semiconductor device includes a plurality of inorganic films of at least one selected from the group consisting of a silicon nitride film and a silicon oxide film, and
    wherein the third insulating film is farthest away from the semiconductor element among the plurality of inorganic films.

4. The semiconductor device as claimed in claim 1,
    wherein the semiconductor substrate has a first plane formed in the first region and a second plane formed in the second region, and
    wherein the second plane is closer to a lower surface of the semiconductor substrate than the first plane.

5. The semiconductor device as claimed in claim 4,
    wherein the semiconductor substrate includes a substrate and a semiconductor layer formed on the substrate, and
    wherein the second plane is formed on the semiconductor layer.

6. The semiconductor device as claimed in claim 1, further comprising a wiring layer formed on the second insulating film, the third insulating film covering the wiring layer.

7. The semiconductor device as claimed in claim 1, further comprising a fourth insulating film formed between the first insulating film and the semiconductor element, and a fifth insulating film formed between the fourth insulating film and the semiconductor element,
    wherein the fifth insulating film allows less moisture to pass than the second insulating film and the fourth insulating film,
    wherein a dielectric constant of the fourth insulating film is lower than the dielectric constant of the first insulating film, the dielectric constant of the third insulating film, and a dielectric constant of the fifth insulating film,
    wherein the fifth insulating film has a third portion that is in contact with a third region of the upper surface of the semiconductor substrate, the third region being closer to the semiconductor element than the first region, and
    wherein the first insulating film is in contact with an upper surface and a side surface of the third portion.

8. The semiconductor device as claimed in claim 7, wherein the fourth insulating film includes polyimide and the fifth insulating film includes silicon nitride or silicon oxide.

9. The semiconductor device as claimed in claim 1, wherein the semiconductor element includes a high electron mobility transistor.

10. A monolithic microwave integrated circuit comprising the semiconductor device as claimed in claim 1.

11. A semiconductor package comprising:
    the semiconductor device as claimed in claim 1; and
    a resin that seals at least the upper surface and a side surface of the semiconductor device.

12. A method of manufacturing a semiconductor device, the method comprising:
    forming a semiconductor element on a semiconductor substrate;
    forming a first insulating film covering the semiconductor element, the first insulating film having a first portion that is in contact with a first region of an upper surface of the semiconductor substrate;

forming a second insulating film on the first insulating film; and forming a third insulating film on the second insulating film;

wherein the first insulating film and the third insulating film allow less moisture to pass than the second insulating film, wherein a dielectric constant of the second insulating film is lower than a dielectric constant of the first insulating film and a dielectric constant of the third insulating film, wherein the third insulating film is formed to have a second portion that is in contact with an upper surface and a side surface of the first portion and that is in contact with a second region of the upper surface of the semiconductor substrate, the second region being farther away from the semiconductor element than the first region.

* * * * *